(12) United States Patent
Sakurai et al.

(10) Patent No.: US 11,810,913 B2
(45) Date of Patent: Nov. 7, 2023

(54) SEMICONDUCTOR DEVICE

(71) Applicant: FUJI ELECTRIC CO., LTD., Kanagawa (JP)

(72) Inventors: Yosuke Sakurai, Azumino (JP); Seiji Noguchi, Matsumoto (JP); Toru Ajiki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/970,601

(22) Filed: Oct. 21, 2022

(65) Prior Publication Data
US 2023/0038105 A1    Feb. 9, 2023

Related U.S. Application Data

(60) Division of application No. 17/159,116, filed on Jan. 26, 2021, now Pat. No. 11,488,951, which is a
(Continued)

(30) Foreign Application Priority Data

Feb. 27, 2019    (JP) .................................. 2019-034869

(51) Int. Cl.
| | |
|---|---|
| H01L 27/06 | (2006.01) |
| H01L 29/423 | (2006.01) |
| H01L 29/739 | (2006.01) |
| H01L 27/07 | (2006.01) |
| H01L 29/36 | (2006.01) |

(52) U.S. Cl.
CPC ...... H01L 27/0664 (2013.01); H01L 27/0727 (2013.01); H01L 29/36 (2013.01);
(Continued)

(58) Field of Classification Search
CPC ............. H01L 27/0664; H01L 27/0727; H01L 29/7395; H01L 29/4236; H01L 29/7397; H01L 29/36
See application file for complete search history.

(56) References Cited

U.S. PATENT DOCUMENTS

| | | |
|---|---|---|
| 4,689,647 A | 8/1987 | Nakagawa |
| 10,658,360 B2 | 5/2020 | Yoshida |
| | (Continued) | |

FOREIGN PATENT DOCUMENTS

| | | |
|---|---|---|
| JP | S6115370 A | 1/1986 |
| JP | 2012069579 A | 4/2012 |
| | (Continued) | |

OTHER PUBLICATIONS

Those references were submitted as IDS or found by the examiner over the earlier U.S. Appl. No. 17/159,116, filed Jan. 26, 2021.

*Primary Examiner* — Joseph C. Nicely

(57) ABSTRACT

Provided is a semiconductor device, comprising: a semiconductor substrate; a transistor portion including an emitter region on the top of the semiconductor substrate; a diode portion including a cathode region on the bottom of the semiconductor substrate and a second conductivity type overlap region in a region other than the cathode region and arranged alongside to the transistor portion a preset arrangement direction on the top of the semiconductor substrate; and an interlayer dielectric film provided between the semiconductor substrate and an emitter electrode and including a contact hole for connecting the emitter electrode and the diode portion. The overlap region is provided to have a first length between the end of the emitter region and the end of the cathode region and a second length, which is shorter than the first length, between the end of the contact hole and the end of the cathode region.

12 Claims, 16 Drawing Sheets

Related U.S. Application Data continuation of application No. PCT/JP2019/047283, filed on Dec. 3, 2019.

(52) U.S. Cl.
CPC ...... *H01L 29/4236* (2013.01); *H01L 29/7395* (2013.01); *H01L 29/7397* (2013.01)

(56) References Cited

U.S. PATENT DOCUMENTS

| | | |
|---|---|---|
| 2012/0068220 A1 | 3/2012 | Kobayashi |
| 2014/0361333 A1 | 12/2014 | Kimura |
| 2016/0247808 A1 | 8/2016 | Horiuchi |
| 2018/0108737 A1 | 4/2018 | Naito |
| 2018/0182754 A1 | 6/2018 | Naito |
| 2018/0197977 A1 | 7/2018 | Kouno |
| 2019/0081163 A1 | 3/2019 | Mizukami |
| 2019/0252534 A1 | 8/2019 | Murakawa |

FOREIGN PATENT DOCUMENTS

| | | |
|---|---|---|
| JP | 2013152996 A | 8/2013 |
| JP | 2017011001 A | 1/2017 |
| JP | 2017045949 A | 3/2017 |
| JP | 2018073911 A | 5/2018 |
| JP | 2018174295 A | 11/2018 |
| WO | 2015068203 A1 | 5/2015 |
| WO | 2017155122 A1 | 9/2017 |
| WO | 2017199679 A1 | 11/2017 | ns
SEMICONDUCTOR DEVICE

CROSS-REFERENCE TO RELATED APPLICATIONS

This application is a divisional of U.S. patent application Ser. No. 17/159,116, filed on Jan. 26, 2021. The contents of the following Japanese patent applications are incorporated herein by reference:
NO. 2019-034869 filed in JP on Feb. 27, 2019, and
PCT/JP2019/047283 filed in WO on Dec. 3, 2019

BACKGROUND

1. Technical Field

The present invention relates to a semiconductor device.

2. Related Art

Conventionally, there is known a semiconductor device in which a transistor portion such as an insulated gate bipolar transistor (IGBT) and a diode portion such as a freewheeling diode (FWD) are provided in a common semiconductor substrate (for example, see Patent Literatures 1 to 5).
Patent Literature 1: WO 2017/155122
Patent Literature 2: Japanese Patent Application Publication No. 2017-11001
Patent Literature 3: WO 2015/068203
Patent Literature 4: Japanese Patent Application Publication No. 2017-45949
Patent Literature 5: Japanese Patent Application Publication No. 2012-69579

A semiconductor device preferably has a high avalanche withstand capability.

General Disclosure

In a first aspect of the invention to solve the above problem, a semiconductor device is provided which includes a semiconductor substrate provided with a first conductivity type drift region. The semiconductor device may be provided with a transistor portion that includes a first conductivity type emitter region having a doping concentration higher than the drift region in a region which is in contact with an upper surface of the semiconductor substrate. The semiconductor device may be provided with a diode portion that includes a first conductivity type cathode region having a doping concentration higher than the drift region in a region which is in contact with a lower surface of the semiconductor substrate, includes a second conductivity type overlap region in a region other than the cathode region, and is arranged side by side with the transistor portion in a preset arrangement direction in an upper surface of the semiconductor substrate. The semiconductor device may be provided with an emitter electrode which is arranged above the semiconductor substrate. The semiconductor device may be provided with an interlayer dielectric film which is provided between the semiconductor substrate and the emitter electrode and is provided with a contact hole for connecting the emitter electrode and the diode portion. The cathode region may be provided on a central side of the diode portion from the end of the emitter region in the arrangement direction. The overlap region may be provided to have a first length between the end of the emitter region and the end of the cathode region. The cathode region may be provided on the central side of the diode portion from the end of the contact hole in the stretching direction orthogonal to the arrangement direction. The overlap region may be provided to have a second length between the end of the contact hole and the end of the cathode region. The first length may be larger than the second length.

The semiconductor device may be provided with a second conductivity type well region which is arranged side by side with the diode portion in the stretching direction in the semiconductor substrate. The overlap region may be provided to have a third length between the end of the well region and the end of the cathode region in the stretching direction. The first length may be larger than the third length.

The diode portion may have a longitudinal side in the stretching direction in the upper surface of the semiconductor substrate.

The semiconductor device may be provided with an upper-surface-side lifetime control portion which is provided on the upper surface side of the semiconductor substrate. The upper-surface-side lifetime control portion may be provided in a region which is in contact with the diode portion in the transistor portion. The first length may be larger than the length from the end of the transistor portion in the arrangement direction to the end of the upper-surface-side lifetime control portion.

The first length at the center of the overlap region in the stretching direction may be smaller than the first length at the end in the stretching direction.

The transistor portion may include a second conductivity type collector region in a region which is in contact with the lower surface of the semiconductor substrate. The overlap region in the arrangement direction may include a portion having a doping concentration higher than the collector region.

The overlap region in the arrangement direction may include a thick portion which has a larger thickness in the depth direction of the semiconductor substrate than the collector region.

In a second aspect of the invention, there is provided a semiconductor device which is provided with a semiconductor substrate having a first conductivity type drift region. The semiconductor device may be provided with a transistor portion that includes a first conductivity type emitter region having a doping concentration higher than the drift region in a region which is in contact with an upper surface of the semiconductor substrate. The semiconductor device may be provided with a diode portion that includes a first conductivity type cathode region having a doping concentration higher than the drift region in a region which is in contact with a lower surface of the semiconductor substrate, and is arranged side by side with the transistor portion in a preset arrangement direction in an upper surface of the semiconductor substrate. The semiconductor device may be provided with a second conductivity type lower surface region that is provided in a region other than the cathode region in a region which is in contact with the lower surface of the semiconductor substrate. The lower surface region may include a thick portion in which the end in a top view has a larger thickness in the depth direction of the semiconductor substrate than other portions.

The lower surface region may include a thick portion at the end in the arrangement direction.

The lower surface region may include a thick portion at the end which is in contact with the cathode region in the arrangement direction.

The lower surface region may include a thick portion at the end in the stretching direction orthogonal to the arrangement direction.

The lower surface region may include a thick portion at the end of the semiconductor substrate in a top view.

The thick portion may be arranged in the transistor portion.

The thick portion may be arranged in the diode portion.

The doping concentration of the thick portion may be higher than the doping concentration of a portion other than the thick portion of the lower surface region.

A buffer region may be provided which is provided between the drift region and the lower surface region and has a doping concentration higher than the drift region. The distance between the drift region and the thick portion may be 1 μm or more.

The buffer region may include a high concentration region and a low concentration region which is arranged side by side with the high concentration region in the arrangement direction, and has a doping concentration lower than the high concentration region. The thick portion may be provided at a position which does not overlap with the low concentration region.

In the arrangement direction, the low concentration region may be arranged on the central side of the transistor portion from the thick portion.

The dopant concentration of the second conductivity type in the lower surface region may be higher than the dopant concentration of the first conductivity type in the cathode region. The lower surface region may be thicker than the cathode region in the depth direction of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Figure 1:
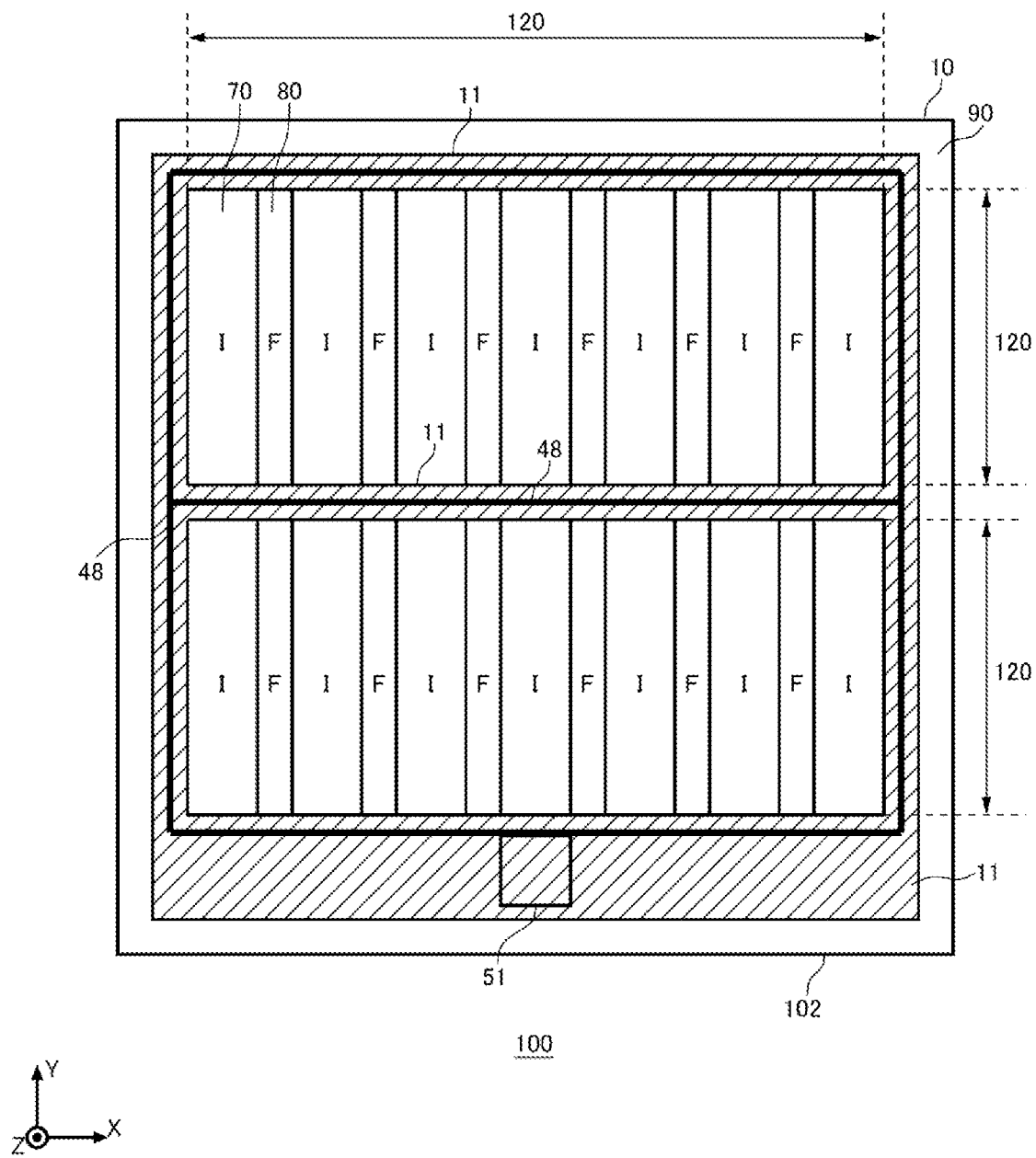
FIG. 1 is a top view illustrating an example of a semiconductor device 100 according to an embodiment of the invention.

Hereinafter, the invention will be described through embodiments of the invention, but the following embodiments do not limit the invention according to claims. In addition, not all of the combinations of features described in the embodiments are essential to the solving means of the invention.

In the present specification, one side in a direction parallel to the depth direction of a semiconductor substrate is referred to as "upper", and the other side is referred to as "lower". One of the two main surfaces of the substrate, layer, or other members is called an upper surface, and the other surface is referred to as a lower surface. The directions of "up" and "down" are not limited to the direction of gravity or the direction when a semiconductor device is mounted.

In this specification, technical matters may be described using orthogonal coordinate axes of an X axis, a Y axis, and a Z axis. The orthogonal coordinate axis is merely to specify a relative position of components, and does not limit a specific direction. For example, the Z axis is not limited to a height direction with respect to the ground surface. Further, a +Z axis direction and a −Z axis direction are directions opposite to each other. When the Z axis direction is described without describing the sign, it means that the direction is parallel to the +Z axis and the −Z axis. In this specification, viewing from the +Z axis direction may be referred to as "in a top view".

In the present specification, the term "same" or "equal" may include a case where there is an error due to manufacturing variation or the like. The corresponding error is within, for example, 10%.

In the present specification, the conductivity type doping region doped with impurities is described as a P type or an N type. However, the conductivity type of each doping region may be of reversed polarity. In addition, in the present specification, the term P+ type or N+ type means that the doping concentration is higher than that of the P type or N type, and the term P− type or N− type means that the doping concentration is lower than that of the P type or N type.

The doping concentration in the present specification indicates a concentration of impurities activated as a donor or an acceptor. In the present specification, a concentration difference between the donor and the acceptor may be referred to as a doping concentration. The concentration difference can be measured by a capacitance-voltage method (CV method). In addition, a carrier concentration measured by a spreading resistance method (SR) may be used as the doping concentration. In addition, in a case where a doping concentration distribution has a peak, the peak may be used as the doping concentration in the corresponding region. In a case where the doping concentration in a region where the donor or the acceptor exist is almost even, an average value of the doping concentration may be used as the doping concentration in the corresponding region. In addition, the dopant concentration of in the present specification indicates a concentration of each of the donor and the acceptor.

FIG. 1 is a top view illustrating an example of a semiconductor device 100 according to an embodiment of the invention. FIG. 1 illustrates positions obtained by projecting members onto the upper surface of a semiconductor substrate 10. In FIG. 1, only some members of the semiconductor device 100 are illustrated, but some members are omitted.

The semiconductor device 100 is provided with the semiconductor substrate 10. The semiconductor substrate 10 is a substrate which is formed of a semiconductor material such as silicon or a compound semiconductor. The semiconductor substrate 10 includes an edge side 102 in a top view. The semiconductor substrate 10 of this example includes two sets of edge sides 102 facing each other in a top view. In FIG. 1, the X axis and the Y axis are parallel with any of the edge sides 102. In addition, the Z axis is perpendicular to the upper surface of the semiconductor substrate 10.

In the semiconductor substrate 10, an active portion 120 is provided. The active portion 120 is a region in which a main current flows in the depth direction, between the upper surface and the lower surface of the semiconductor substrate 10 in a case where the semiconductor device 100 is controlled to an ON state. In the active portion 120, there is provided a transistor portion 70 which includes a transistor element such as an IGBT, and a diode portion 80 which includes a diode element such as a FWD. The active portion 120 may be a region where the transistor portion 70 and the diode portion 80 are provided.

In FIG. 1, Symbol "I" is attached to the region where the transistor portion 70 is disposed, and Symbol "F" is attached to the region where the diode portion 80 is disposed. The transistor portion 70 and the diode portion 80 are arranged side by side along a predetermined arrangement direction (the X axis direction in FIG. 1). The transistor portion 70 and the diode portion 80 may be alternately arranged side by side in the X axis direction. In the present specification, a direction perpendicular to the arrangement direction in a top view is referred to as a stretching direction (the Y axis direction in FIG. 1). The transistor portion 70 and the diode portion 80 may each include a longitudinal side in the stretching direction. In other words, the length in the Y axis direction of the transistor portion 70 is larger than the width in the X axis direction. Similarly, the length in the Y axis direction of the diode portion 80 is larger than the width in the X axis direction. In a case where the active portion 120 is divided in a top view, the transistor portion 70 and the diode portion 80 may be alternately arranged side by side in the X axis direction in each region of the active portion 120.

In the semiconductor substrate 10, a P-type well region 11 is provided. The well region 11 is a region which has a doping concentration higher than a base region described later, is formed to abut on the upper surface of the semiconductor substrate 10, and is formed to a position deeper than the bottom of the base region. The depth is a depth based on the upper surface of the semiconductor substrate 10 as a reference position. FIG. 1 illustrates an arrangement example of the well region 11 in the upper surface of the semiconductor substrate 10. In FIG. 1, the well region is hatched with inclined lines.

The well region 11 may be provided to surround the active portion 120 in a top view. The well region 11 may surround a plurality of regions in a top view, and be provided with the active portion 120 in each region. In the example of FIG. 1, two active portions 120 are arranged side by side along the Y axis direction. The well region 11 is provided between the two active portions 120 in a top view.

The semiconductor device 100 may be provided with a gate pad 51 and a gate runner 48. The gate runner 48 in FIG. 1 is illustrated with a thick solid line. The gate pad 51 and the gate runner 48 are arranged above the semiconductor substrate 10. An interlayer dielectric film is provided between the semiconductor substrate 10, and the gate pad 51 and the gate runner 48, but is omitted in FIG. 1.

The gate pad 51 is an electrode which contains a metal such as aluminum. The gate runner 48 is a wiring for electrically connecting the gate pad 51 and the transistor portion 70. The gate runner 48 may be a metal wiring containing a metal such as aluminum, or may be a semiconductor wiring containing polysilicon doped with impurities. The gate runner 48 may include a portion where one of the metal wiring and the semiconductor wiring is provided, or may include a portion where both the metal wiring and the semiconductor wiring are provided in parallel.

The gate pad 51 and the gate runner 48 are arranged above the well region 11. The gate pad 51 is arranged between the active portion 120 and the edge side 102 in a top view. The gate runner 48 may be arranged to surround the active portion 120. The gate runner 48 may include a portion where the gate runner 48 is arranged between the active portion 120 and the edge side 102 in a top view. The gate runner 48 may include a portion where the gate runner 48 is arranged between two active portions 120 in a top view.

In the gate pad 51, a predetermined gate voltage is applied. The gate voltage applied to the gate pad 51 is supplied to the transistor portion 70 by the gate runner 48.

On the upper side of the active portion 120, an emitter electrode is provided, but it is omitted in FIG. 1. The emitter electrode may cover the entire active portion 120. The emitter electrode is an electrode which contains a metal such as aluminum. An interlayer dielectric film is provided between the emitter electrode and the semiconductor substrate 10. The emitter electrode and the semiconductor substrate 10 are connected via a contact hole provided on the interlayer dielectric film. In FIG. 1, the insulating film and the contact hole are omitted.

The semiconductor device 100 may be provided with an edge terminal structure portion 90 between the well region 11 and the edge side 102 of the semiconductor substrate 10. The edge terminal structure portion 90 relaxes an electric field concentration on the upper surface side of the semiconductor substrate 10. The edge terminal structure portion 90 has structure of, for example, a guard ring provided in an annular shape surrounding the active portion 120, a field plate, a RESURF, and a combination thereof.

Figure 2:
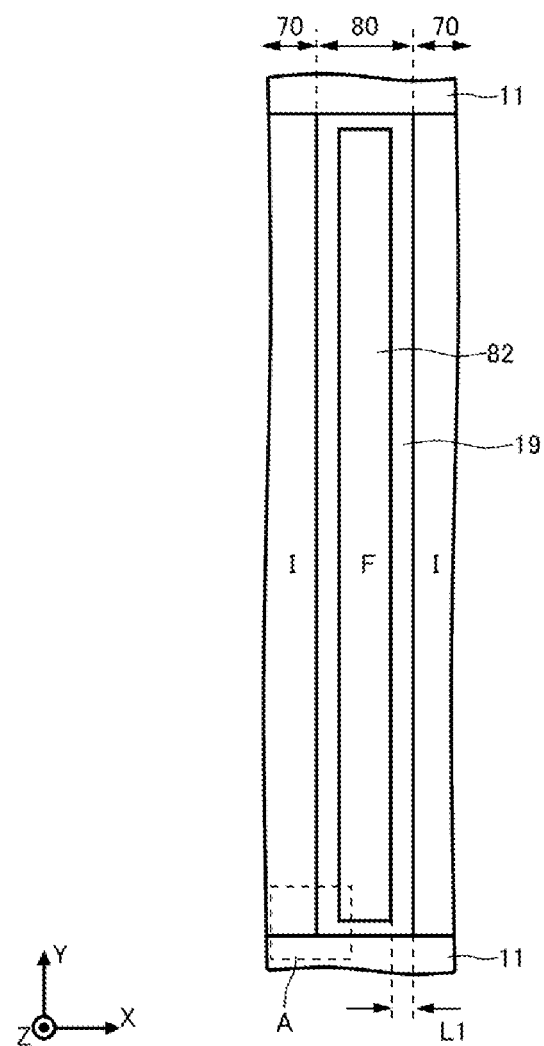
FIG. 2 is a top view illustrating the vicinity of a diode portion 80 on a magnified scale.

FIG. 2 is a top view illustrating the vicinity of the diode portion 80 on a magnified scale. The diode portion 80 includes a cathode region 82 which is in contact with the lower surface of the semiconductor substrate 10. The cathode region 82 is an N-type region. The transistor portion 70 includes a P-type lower surface region 19 which is in contact with the lower surface of the semiconductor substrate 10. In this example, the lower surface region 19 is provided in the entire transistor portion 70. In addition, the lower surface region 19 is also provided in a portion in contact with the transistor portion 70 in the diode portion 80.

As a destruction mode of the semiconductor device 100, an avalanche breakdown is known. In the semiconductor device 100 including IGBT and the like, it is preferable to improve a current density. In addition, the semiconductor substrate 10 may be made to have high specific resistance in order to reduce the thickness of the semiconductor substrate 10. When the current density is improved, and the semiconductor substrate 10 is made to have high specific resistance, the electric field is concentrated on the lower surface side of the semiconductor substrate 10 at the time of short. Therefore, a rear-surface avalanche breakdown is likely to occur.

The withstand capability to the rear-surface avalanche breakdown can be improved by increasing the amount of hole implantation from the lower surface side of the semiconductor substrate 10. However, since an N-type cathode region is generally provided on the lower surface side of the diode portion 80, the amount of hole implantation from the lower surface side of the diode portion 80 is relatively small. Therefore, the rear-surface avalanche breakdown is likely to occur at the boundary between the transistor portion 70 and the diode portion 80.

In the semiconductor device 100 of this example, the lower surface region 19 is provided in a part of the diode portion 80 in contact with the transistor portion 70 instead of the cathode region 82. As a result, the amount of hole implantation from the lower surface side increases in the boundary between the transistor portion 70 and the diode portion 80. Therefore, it is possible to improve the rear-surface avalanche withstand capability.

In this example, the length in the arrangement direction (X axis direction) of the lower surface region 19 provided in the diode portion 80 is set to L1. As the length L1 becomes larger, the amount of hole implantation from the lower surface side increased in the boundary between the transistor portion 70 and the diode portion 80.

The transistor portion 70 and the diode portion 80 may arranged side by side with the well region 11 in the stretching direction (Y axis direction). The transistor portion 70 and the diode portion 80 of this example are sandwiched by two well regions 11 in the stretching direction. The diode portion 80 may be provided with the lower surface region 19 also in the boundary with respect to the well region 11. As described above, the well region 11 is provided with a relatively high concentration and deep. Therefore, the breakdown voltage is lowered if the distance between the well region 11 and the cathode region 82 is too close. In a top view, the lower surface region 19 is provided between the well region 11 and the cathode region 82, so that the distance between the well region 11 and the cathode region 82 can be secured, and the breakdown voltage can be secure.

Figure 3:
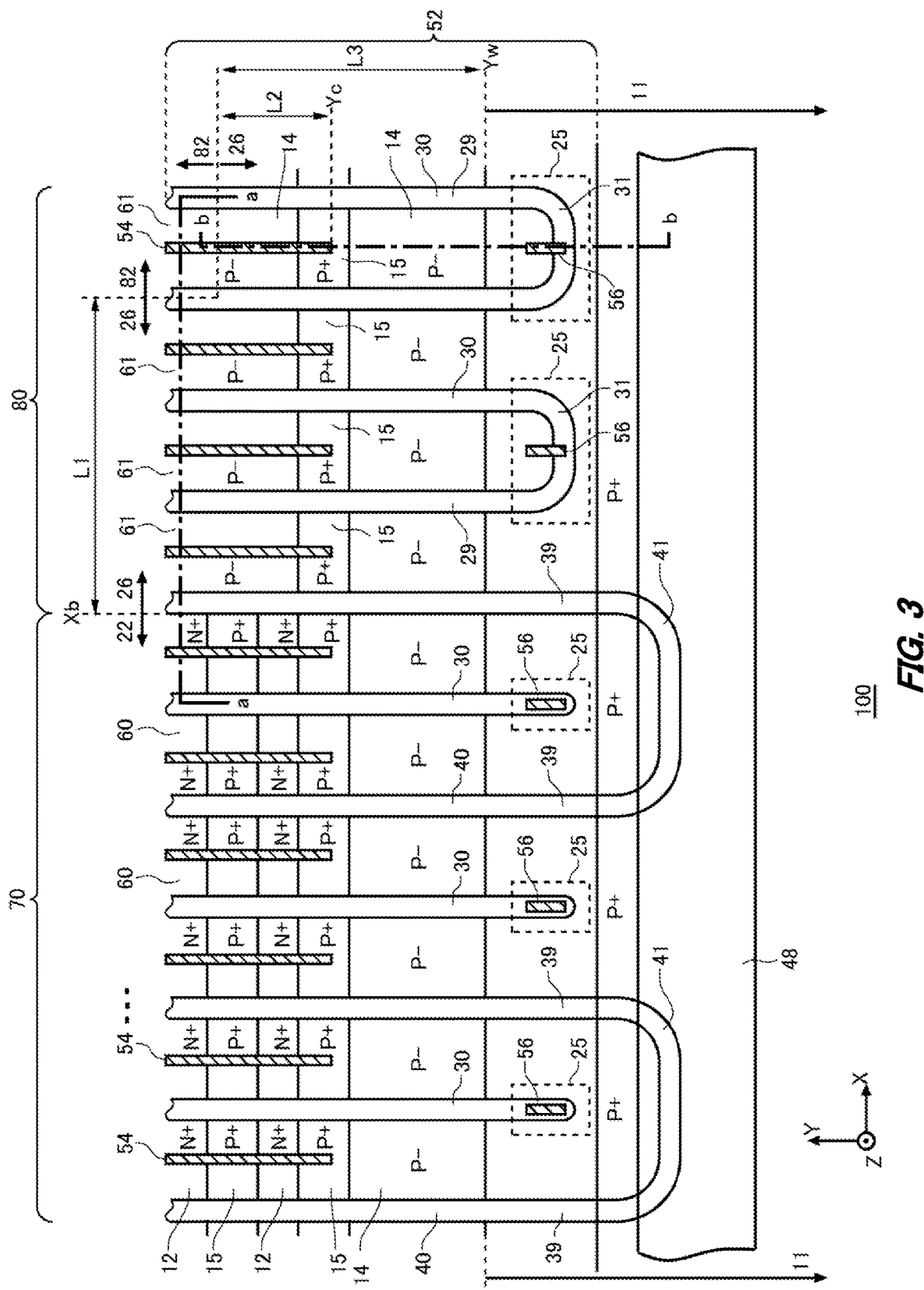
FIG. 3 is a top view illustrating Region Ain FIG. 2 on a magnified scale.

FIG. 3 is a top view illustrating Region A in FIG. 2 on a magnified scale. The semiconductor substrate 10 of this example is provided with a gate trench portion 40 in contact with the upper surface of the semiconductor substrate 10, a dummy trench portion 30, the well region 11, an emitter region 12, a base region 14, and a contact region 15. In addition, the semiconductor substrate 10 of this example is provided with the cathode region 82 and the lower surface region 19 which are in contact with the lower surface of the semiconductor substrate 10.

In addition, an emitter electrode 52 and the gate runner 48 are provided above the semiconductor substrate 10. FIG. 3 illustrates the range where the emitter electrode 52 is provided with a dotted line. The emitter electrode 52 is arranged above the transistor portion 70 and the diode portion 80. The emitter electrode 52 may include a portion overlapping with the well region 11.

The interlayer dielectric film is provided between the emitter electrode 52 and the upper surface of the semiconductor substrate 10, but is omitted in FIG. 3. In the interlayer dielectric film of this example, a contact hole 56 and a contact hole 54 are provided to pass through the interlayer dielectric film.

The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole 56. A connection portion 25 formed of a material having conductivity such as polysilicon doped with impurities may be provided between the emitter electrode 52 and the dummy conductive portion. The connection portion 25 is provided in the upper surface of the semiconductor substrate 10. An insulating film such as a thermal oxide film is provided between the connection portion 25 and the semiconductor substrate 10.

An insulating film such as a thermal oxide film is provided between the gate runner 48 and the semiconductor substrate 10. The gate runner 48 is connected to a gate conductive portion in the gate trench portion 40 in the upper surface of the semiconductor substrate 10. The gate runner 48 is not connected to a dummy conductive portion in the dummy trench portion 30. The gate runner 48 of this example is provided to be overlapped with an edge portion 41 of the gate trench portion 40. The edge portion 41 is the end portion in the stretching direction (Y axis direction) of the gate trench portion 40. The gate conductive portion in the edge portion 41 of the gate trench portion 40 is exposed to the upper surface of the semiconductor substrate 10, and is in contact with the gate runner 48.

The emitter electrode 52 is formed of a material containing metal. For example, at least a partial region of the emitter electrode 52 is formed of aluminum or an aluminum-silicon alloy. The emitter electrode 52 may have a barrier metal formed of titan or a titan compound in the lower layer of the region formed of aluminum or the like. Further, in the contact hole, a plug formed with tungsten buried therein may be included to be in contact with the barrier metal and aluminum.

The transistor portion 70 is provided with the gate trench portion 40. The diode portion 80 is provided with the dummy trench portion 30. The transistor portion 70 may be provided with the dummy trench portion 30.

In the transistor portion 70 of this example, the gate trench portion 40 and the dummy trench portion 30 are arranged alternately at a predetermined interval along the X axis direction. In the diode portion 80 of this example, the dummy trench portion 30 is arranged at a predetermined interval.

The gate trench portion 40 of this example may include two stretching portions 39 (a trench portion of a linear shape along the Y axis direction) extending along the Y axis direction and the edge portion 41 for connecting the two stretching portions 39. At least a part of the edge portion 41 is desirably provided in a curved shape. The electric field concentration can be relaxed in the tip of the gate trench portion 40 by connecting the two stretching portions 39 of the gate trench portion 40 to the edge portion 41.

The dummy trench portion 30 of this example is provided between the stretching portions 39. These dummy trench portions 30 may be in a linear shape that extends in the Y axis direction. In addition, the dummy trench portion 30 in the diode portion 80 may include a stretching portion 29 and an edge portion 31 similarly to the gate trench portion 40. The length of the dummy trench portion 30 in the Y axis direction may be shorter than the gate trench portion 40. The edge portion 31 is arranged at a position overlapping with the emitter electrode 52, and is connected to the emitter electrode 52 via the connection portion 25.

In the semiconductor substrate 10, a region sandwiched by the stretching portions of the trench portions is called a mesa portion. A mesa portion 60 is provided in the transistor portion 70, and a mesa portion 61 is provided in the diode portion 80. The mesa portion is a region on the upper surface side from the deepest bottom of the trench portion in the portion of the semiconductor substrate 10 sandwiched by the trench portions.

The base region 14 is provided in each mesa portion. The base region 14 of this example is a P⁻ type. The base region 14 is exposed to a part of the upper surface of the mesa portion.

The contact region 15 and the emitter region 12 are provided in the upper surface of the base region 14 of the mesa portion 60 of the transistor portion 70. The contact region 15 of this example is a P+ type having a higher doping concentration than the base region 14. The emitter region 12 of this example is an N+ type having a higher doping concentration than a drift region described later.

The emitter region 12 is provided to be in contact with the gate trench portion 40 in the upper surface of the semiconductor substrate 10. The emitter region 12 and the contact region 15 of this example are provided from one trench portion sandwiching the mesa portion 60 to the other trench portion. In the upper surface of the mesa portion 60 of this example, the contact region 15 and the emitter region 12 are arranged alternately along the Y axis direction. The contact region 15 arranged at the endmost portion in the Y axis direction among the contact regions 15 provided in the mesa portion 60 may be provided at a position overlapping with the end portion in the Y axis direction of the contact hole 54. The emitter region 12 is arranged in a range where the contact hole 54 is provided in the Y axis direction.

In another example, the contact region 15 and the emitter region 12 may be provided in a stripe shape along the stretching direction in the mesa portion 60. For example, the emitter region 12 is provided in a region in direct contact with the trench portion, and the contact region 15 is provided in a region sandwiched between the emitter regions 12. In the upper surface of the mesa portion 60, the base region 14 may be arranged, which sandwiches, in the Y axis direction, the region where the contact region 15 and the emitter region 12 are provided. In the upper surface of the mesa portion 60, the well region 11 may be arranged, which sandwiches, in the Y axis direction, the region where the contact region 15, the emitter region 12, and the base region 14 are provided. The edge portion 41 of the gate trench portion 40 is arranged at a position overlapping with the well region 11.

In the present specification, the region where the gate trench portion 40 and the emitter region 12 are periodically arranged is set to the transistor portion 70. The emitter region 12 which is arranged at the endmost portion in the X axis direction among the emitter regions 12 periodically arranged in the X axis direction is set to the emitter region 12 of the end of the transistor portion 70. In the present specification, an end position Xb of the X axis direction of the emitter region 12 of the end is set to the boundary between the transistor portion 70 and the diode portion 80 in the X axis direction. The end position Xb of the X axis direction of the emitter region 12 of the end is set to the boundary between the emitter region 12 and the trench portion in the upper surface of the semiconductor substrate 10.

In the mesa portion 61 of the diode portion 80, the emitter region 12 may be not provided. In the upper surface of the mesa portion 61, a P-type region may be arranged. In the upper surface of the mesa portion 61 of this example, the base region 14 is provided. The base region 14 may occupy an area more than the half of the area of the upper surface of the mesa portion 61. In the upper surface of the mesa portion 61, the contact region 15 may be arranged. The contact region 15 of the mesa portion 61 may be provided at a position overlapping with the end in the Y axis direction of the contact hole 54. In the upper surface of the mesa portion 61, the base region 14 may be provided, which sandwiches the contact region 15 in the Y axis direction. In the upper surface of the mesa portion 61, the well region 11 may be provided, which sandwiches, in the Y axis direction, the region where the base region 14 and the contact region 15 are provided. The edge portion 31 of the dummy trench portion 30 is arranged at a position overlapping with the well region 11.

The contact hole 54 provided in the transistor portion 70 and the contact hole 54 provided in the diode portion 80 may have the same length or different lengths in the Y axis direction. In the transistor portion 70, the contact hole 54 is provided above each of the contact region 15 and the emitter region 12. The contact hole 54 of this example is not provided in the region corresponding to the base region 14 and the well region 11 of the mesa portion 60. In the diode portion 80, the contact hole 54 is provided above the contact region 15 and the base region 14. However, the contact hole 54 is not provided above the base region 14 sandwiched by the contact region 15 and the well region 11 in the mesa portion 61.

In the diode portion 80, the N+ type cathode region 82 is provided in a region which is in contact with the lower surface of the semiconductor substrate 10. The lower surface region 19 is provided in a region where the cathode region 82 is not provided in the region which is in contact with the lower surface of the semiconductor substrate 10. In this example, the lower surface region 19 provided in the transistor portion 70 is set to a collector region 22. In addition, the lower surface region 19 provided in the diode portion 80 is set to an overlap region 26. The collector region 22 and the overlap region 26 may have the same doping concentration, or may have different doping concentrations. In FIG. 3, the boundaries among the cathode region 82, the overlap region 26, and the collector region 22 are illustrated with a dotted line.

In this example, the cathode region 82 is provided, in the X axis direction, closer to the central side of the diode portion 80 than the end position Xb of the emitter region 12. In other words, the diode portion 80 includes, in the X axis direction, the overlap region 26 between the end position Xb of the emitter region 12 and the end portion of the cathode region 82. The length of the overlap region 26 in the X axis direction is set to a first length L1.

In addition, the cathode region 82 is provided, in the Y axis direction, closer to the central side of the diode portion 80 than an end position Yc of the contact hole 54. In other words, the diode portion 80 includes, in the Y axis direction, the overlap region 26 between the end position Yc of the contact hole 54 and the end portion of the cathode region 82. The length of the overlap region 26 between the end position Yc of the contact hole 54 and the end portion of the cathode region 82 is set to a second length L2.

The first length L1 of the overlap region 26 is larger than the second length L2. In this way, it is possible to increase the amount of hole implantation from the lower surface side of the semiconductor substrate 10 at the boundary between the diode portion 80 and the transistor portion 70 in the X axis direction. As a result, it is possible to improve the rear-surface avalanche withstand capability. The first length L1 may be twice or more than the second length L2, or may be five times or more. In addition, it is possible to secure the area of the cathode region 82 by making the second length L2 relatively small.

In this example, the overlap region 26 is provided, in the Y axis direction, also between an end position Yw of the well region 11 and the end position Yc of the contact hole 54. In other words, the diode portion 80 includes, in the Y axis direction, the overlap region 26 between the end position Yw of the well region 11 and the end portion of the cathode region 82. The length of the overlap region 26 between the end position Yw of the well region 11 and the end portion of the cathode region 82 is set to a third length L3.

The first length L1 of the overlap region 26 may be larger than the third length L3. In this way, it is possible to further increase the amount of hole implantation from the lower surface side of the semiconductor substrate 10 at the boundary between the diode portion 80 and the transistor portion 70 in the X axis direction. Therefore, it is possible to further improve the rear-surface avalanche withstand capability. The first length L1 may be twice or more than the third length L3. In addition, it is possible to secure the area of the cathode region 82 by making the third length L3 relatively small.

The first length L1 of the overlap region 26 may be 20 μm or more, may be 50 μm or more, or may be 100 μm or more. In addition, the overlap region 26 may be provided over a plurality of mesa portions 61 in the X axis direction. By increasing the first length L1, it is possible to increase the amount of hole implantation from the lower surface side of the semiconductor substrate 10 at the boundary between the diode portion 80 and the transistor portion 70 in the X axis direction.

In addition, the diode portion 80 may have a longitudinal side in the Y axis direction in the upper surface of the semiconductor substrate 10. The diode portion 80 may be a region surrounded by the transistor portion 70 and the well region 11 in the upper surface of the semiconductor substrate 10. The diode portion 80 may be a region where the gate trench portion 40 and the emitter region 12 are not provided. When the diode portion 80 has the longitudinal side in the Y axis direction, the boundary region between the diode portion 80 and the transistor portion 70 increases, and the rear-surface avalanche breakdown is likely to occur. On the other hand, the rear-surface avalanche breakdown can be suppressed by increasing the first length L1 of the overlap region 26.

Figure 4:
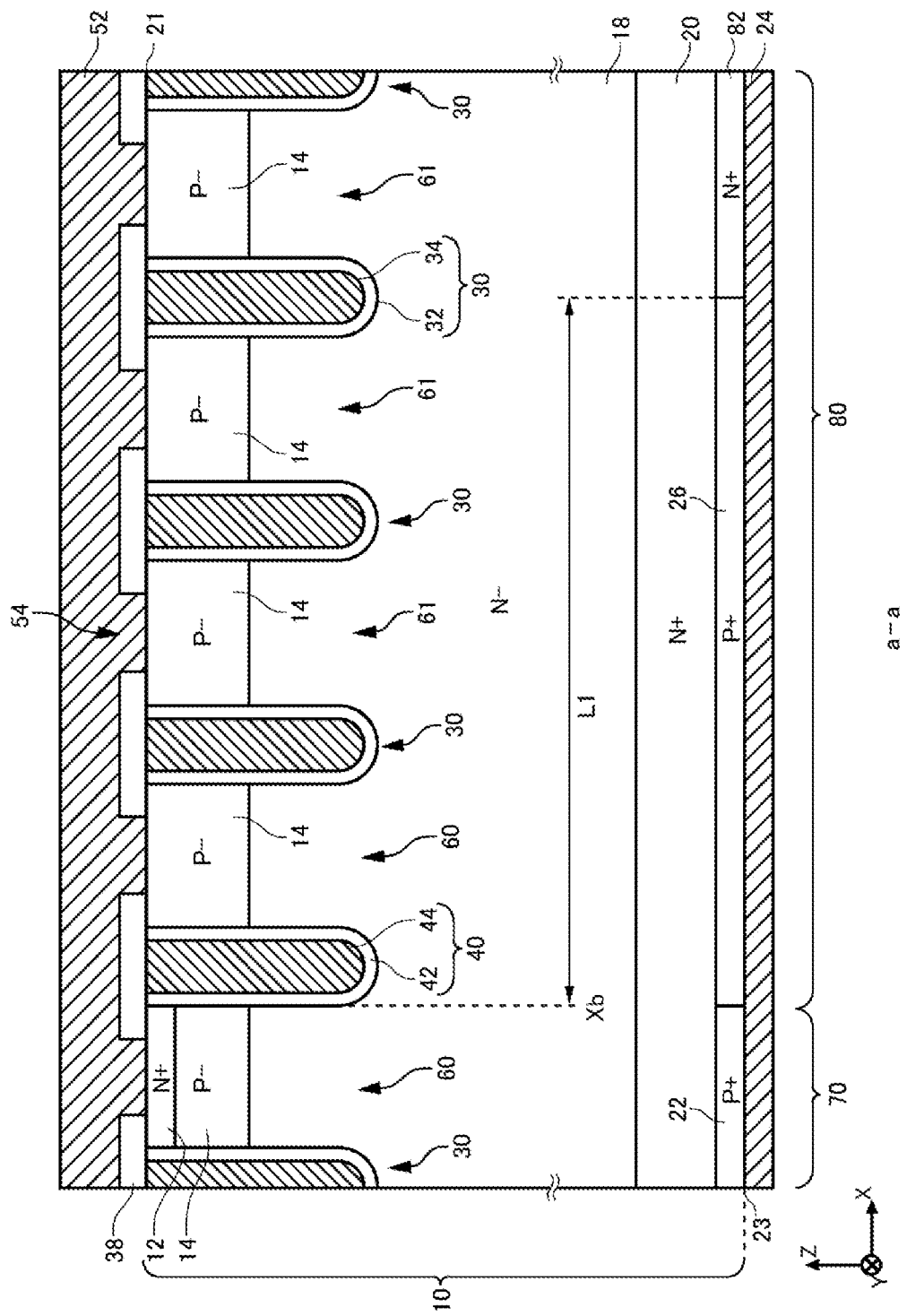
FIG. 4 is a diagram illustrating an example of an a-a cross section in FIG. 3.

FIG. 4 is a diagram illustrating an example of an a-a cross section in FIG. 3. The a-a cross section is the XZ plane passing through the emitter region 12. The semiconductor device 100 of this example includes the semiconductor substrate 10, an interlayer dielectric film 38, the emitter electrode 52, and a collector electrode 24 in the corresponding cross section. The emitter electrode 52 is provided in the upper surface of the semiconductor substrate 10 and the interlayer dielectric film 38. The interlayer dielectric film 38 may be a thermal oxide film, may be a glass such as BPSG, or may be other insulating films. In addition, the interlayer dielectric film 38 may be a film where a plurality of insulating films are stacked.

The collector electrode 24 is provided in a lower surface 23 of the semiconductor substrate 10. The emitter electrode 52 and the collector electrode 24 are formed of a conductive material such as metal or the like. In the present specification, the direction connecting the emitter electrode 52 and the collector electrode 24 is called a depth direction.

The P$^-$ type base region 14 is provided on the upper surface 21 side of the semiconductor substrate 10 of the corresponding cross section. In the corresponding cross section, the N+ type emitter region 12 and the P$^-$ type base region 14 are provided on the upper surface 21 side of the semiconductor substrate 10 in the transistor portion 70 to be sequentially from the upper surface 21 of the semiconductor substrate 10. An N+ type accumulation region may be provided below the base region 14. In the corresponding cross section, the P$^-$ type base region 14 is provided on the upper surface 21 side of the semiconductor substrate 10 in the diode portion 80.

In the transistor portion 70 and the diode portion 80, an N$^-$ type drift region 18 is provided below the base region 14. In the transistor portion 70 and the diode portion 80, an N+ type buffer region 20 is provided below the drift region 18.

The doping concentration of the buffer region 20 is higher than the doping concentration of the drift region 18. The buffer region 20 may serve as a field stopper layer with which a depletion layer expanding from the lower surface of the base region 14 is prevented from reaching the collector region 22, the overlap region 26, and the cathode region 82.

In the transistor portion 70, the P+ type collector region 22 is provided below the buffer region 20. In the diode portion 80, the P+ type overlap region 26 and the cathode region 82 are provided below the buffer region 20. The overlap region 26 is arranged between the cathode region 82 and the collector region 22. As described in FIG. 3, the overlap region 26 has the first length L1 in the X axis direction.

The doping concentration of the overlap region 26 is higher than that of the base region 14. In this example, the doping concentration of the overlap region 26 is the same as the doping concentration of the collector region 22. In addition, the thickness in the Z axis direction of the overlap region 26 is the same as the thickness in the Z axis direction of the collector region 22. The overlap region 26 may be formed in the same process as the collector region 22.

On the upper surface 21 side of the semiconductor substrate 10, one or more gate trench portions 40 and one or more dummy trench portions 30 are provided. Each trench portion is provided to pass through the base region 14 from the upper surface 21 of the semiconductor substrate 10 so as to reach the drift region 18. In the region where at least one of the emitter region 12 and the contact region 15 is provided, each trench portion also passes through these regions and reaches the drift region 18. The configuration that the trench portion passes through the doping region is not limited to the one manufactured in the order of forming the doping region and then forming the trench portion. The configuration that the doping region is formed between the trench portions after forming the trench portion includes a configuration that the trench portion passes through the doping region.

The gate trench portion 40 includes a gate insulating film 42 and a gate conductive portion 44 which are provided on the upper surface 21 side of the semiconductor substrate 10. The gate insulating film 42 is provided to cover the inner wall of the gate trench portion 40. The gate insulating film 42 may be formed by oxidizing or nitriding a semiconductor of the inner wall of the gate trench portion 40. The gate conductive portion 44 is provided inner side from the gate insulating film 42 in the gate trench portion 40. In other words, the gate insulating film 42 insulates the gate conductive portion 44 from the semiconductor substrate 10. The gate conductive portion 44 is formed of a conductive material such as polysilicon or the like.

The gate conductive portion 44 includes a region which sandwiches the gate insulating film 42 and faces the base region 14. The gate trench portion 40 in the corresponding cross section is covered by the interlayer dielectric film 38 in the upper surface 21 of the semiconductor substrate 10. When a predetermined voltage is applied to the gate conductive portion 44, a channel is formed by an electron inversion layer on the surface of the base region 14 at the boundary in contact with the gate trench.

The dummy trench portion 30 may have the same structure as the gate trench portion 40 in the corresponding cross section. The dummy trench portion 30 includes a dummy trench provided on the upper surface 21 side of the semiconductor substrate 10, a dummy insulating film 32, and a dummy conductive portion 34. The dummy insulating film 32 is provided to cover the inner wall of the dummy trench. The dummy conductive portion 34 is provided in the dummy trench, and is provided inner side from the dummy insulating film 32. The dummy insulating film 32 insulates the dummy conductive portion 34 from the semiconductor substrate 10. The dummy conductive portion 34 may be formed of the same material as the gate conductive portion 44.

Figure 5:
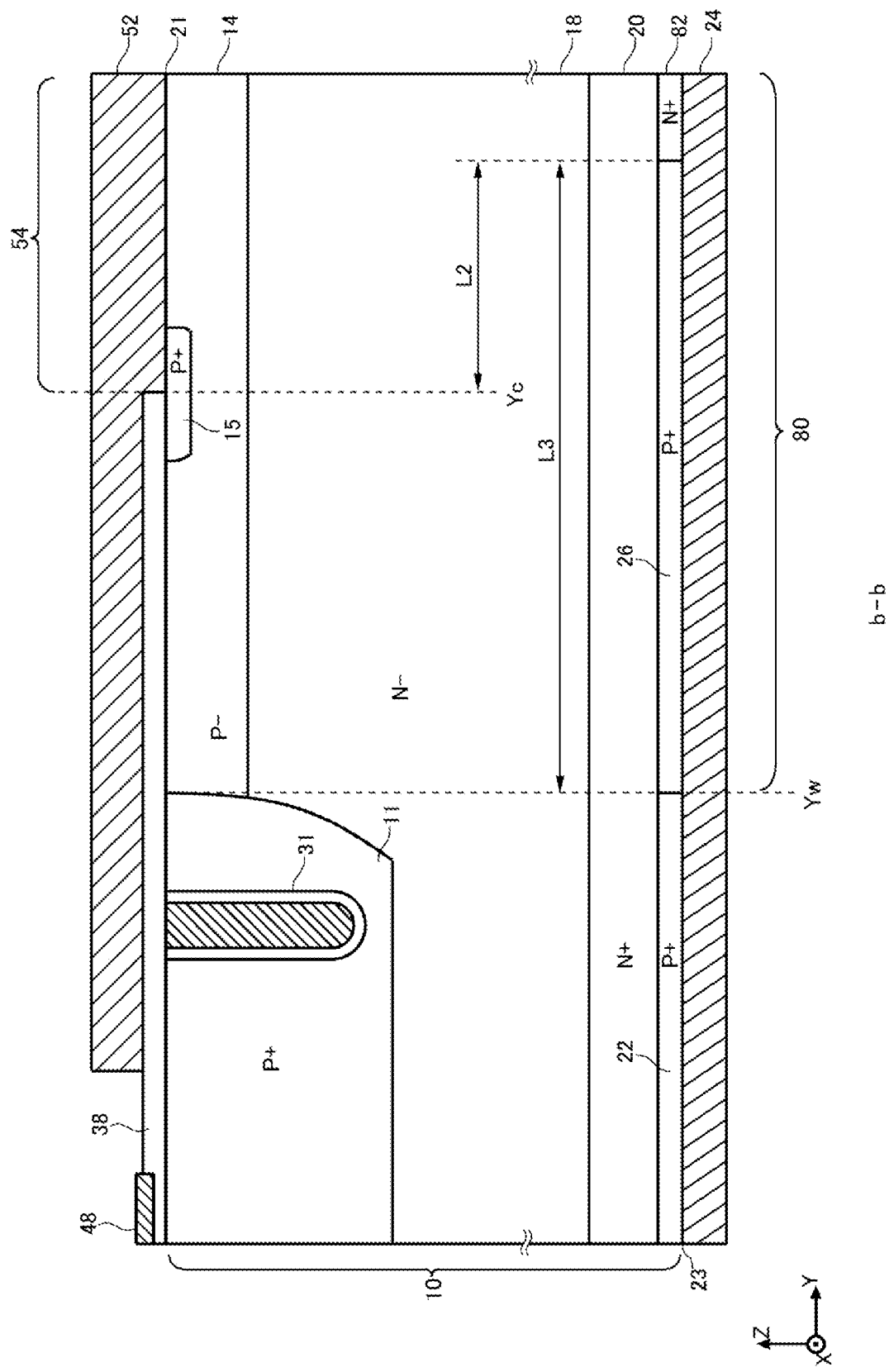
FIG. 5 is a diagram illustrating an example of a cross section take along b-b in FIG. 3.

FIG. 5 is a diagram illustrating an example of a b-b cross section in FIG. 3. The b-b cross section is the YZ plane containing the diode portion 80. In the diode portion 80, the base region 14 is provided in a region which is in contact with the upper surface 21 of the semiconductor substrate 10. The base region 14 is connected to the emitter electrode 52 via the contact hole 54 which is provided in the interlayer dielectric film 38. At the end position Yc of the contact hole 54, the contact region 15 is provided in a region where is in contact with the upper surface 21 of the semiconductor substrate 10. As described in FIG. 3, the overlap region 26 between the end position Ye of the contact hole 54 and the end position of the cathode region 82 has the second length L2.

In the Y axis direction, the well region 11 is provided on the outer side of the diode portion 80. The boundary between the well region 11 and the base region 14 may be the end portion in the Y axis direction of the diode portion 80. In a case where the boundary between the base region 14 and the well region 11 is unclear, a position closest to the base region 14 among the positions at which the average doping concentration of the base region 14 becomes Da and the doping concentration in the well region 11 becomes 2×Da may be set as the boundary between the base region 14 and the well region 11. As these doping concentrations, the doping concentration in the upper surface 21 of the semiconductor substrate 10 may be used. As described in FIG. 3, the overlap region 26 between the end position Yw of the well region 11 and the end position of the cathode region 82 has the third length L3.

Figure 6:
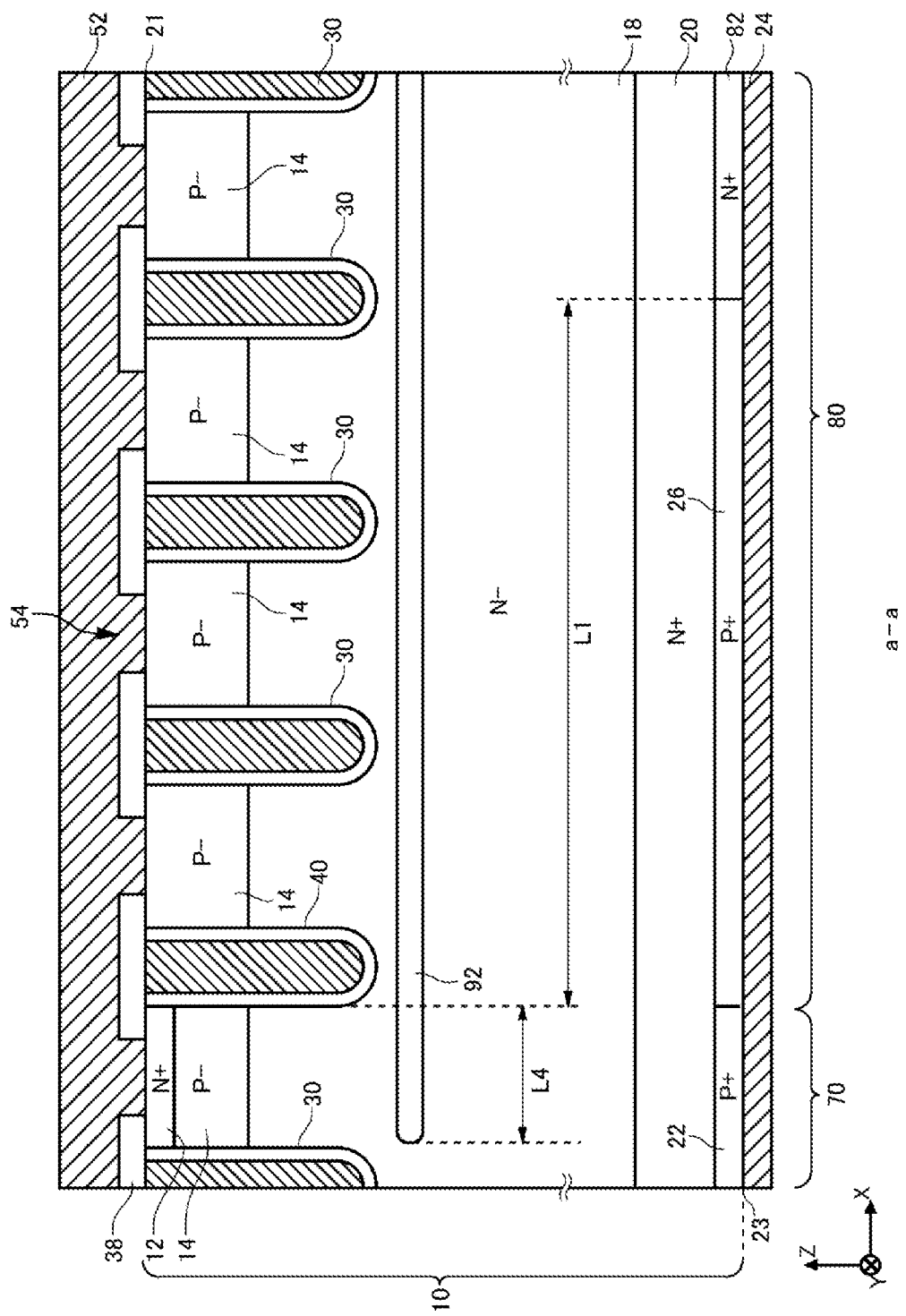
FIG. 6 is a diagram illustrating another example of the a-a cross section in FIG. 3.

FIG. 6 is a diagram illustrating another example of the a-a cross section in FIG. 3. The semiconductor device 100 of this example includes an upper-surface-side lifetime control portion 92 which is provided on the upper surface side of the semiconductor substrate 10. The upper surface side of the semiconductor substrate 10 indicates a region closer to the upper surface 21 than the center of the depth direction of the semiconductor substrate 10. The upper-surface-side lifetime control portion 92 is a region where the concentration of the recombination center of carriers (electrons or holes) is set to be higher than that of the surrounding. The recombination center may be a vacancy defect such as vacancy or vacancy cluster, may be dislocation, may be interstitial atoms, may be transition metal or the like. The upper-surface-side lifetime control portion 92 may be formed, for example, by locally implanting particles such as helium or proton from the upper surface 21 of the semiconductor substrate 10.

The upper-surface-side lifetime control portion 92 of this example is provided in the entire diode portion 80. As a result, the lifetime of the diode portion 80 can be shortened, and the reverse recovery time can be shortened. In addition, the upper-surface-side lifetime control portion 92 is provided even in the region in contact with the diode portion 80 in the transistor portion 70. As a result, it is possible to suppress the flow of the carrier between the upper surface of the transistor portion 70 and the cathode region 82 of the diode portion 80.

In this example, the length in the X axis direction of the upper-surface-side lifetime control portion 92 provided in the transistor portion 70 is set to a fourth length L4. The fourth length L4 is a length in the X axis direction from the end position Xb of the transistor portion 70 to the end position of the upper-surface-side lifetime control portion 92.

The first length L1 of the overlap region 26 in the diode portion 80 may be longer than the fourth length L4 of the upper-surface-side lifetime control portion 92. By increasing the first length L1 of the overlap region 26, the rear-surface avalanche breakdown can be suppressed in the boundary between the transistor portion 70 and the diode portion 80. In addition, by increasing the first length L1 of the overlap region 26, the cathode region 82 can be arranged at a position away from the transistor portion 70. As a result, it is possible to suppress the flow of the carrier between the upper surface of the transistor portion 70 and the cathode region 82 of the diode portion 80 even if the fourth length L4 of the upper-surface-side lifetime control portion 92 is decreased. By decreasing the fourth length L4 of the upper-surface-side lifetime control portion 92, it is possible to reduce the influence of the upper-surface-side lifetime control portion 92 on the characteristics of the transistor portion 70.

Figure 7:
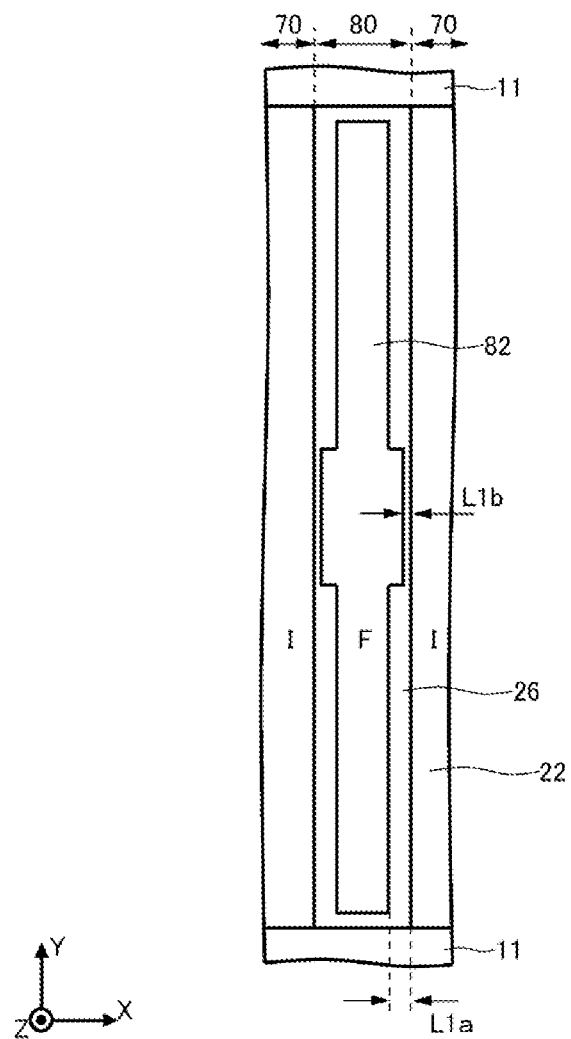
FIG. 7 is a diagram illustrating an arrangement example of a cathode region 82 and an overlap region 26 in a top view.

FIG. 7 is a diagram illustrating an arrangement example of the cathode region 82 and the overlap region 26 in a top view. In the example of FIG. 2, the overlap region 26 (that is, the P type lower surface region 19 in the diode portion 80) has a constant width L1 in the X axis direction. In other words, the overlap region 26 is a rectangular shape in a top view. In the overlap region 26 of this example, a first length L1$b$ in the center in the Y axis direction is smaller than a first length L1$a$ at the end in the Y axis direction.

At the end in the Y axis direction of the diode portion 80 (that is, the corner of the diode portion 80 in a top view), the electric field is likely to concentrate, and the rear-surface avalanche breakdown is more likely to occur than the center in the Y axis direction. In this example, the rear-surface avalanche breakdown in the corner of the diode portion 80 can be suppressed by setting the first length L1$a$ larger than the first length L1$b$. In addition, the area of the cathode region 82 is increased by decreasing the first length L1$b$, so that the characteristics of the diode portion 80 can be improved. The first length L1$b$ may be zero. In other words, the overlap region 26 may be not provided in the center in the Y axis direction of the diode portion 80. In the example of FIG. 7, the width of the overlap region 26 in the X axis direction is changed in a step shape, but the width of the overlap region 26 in the X axis direction may be changed continuously.

Figure 8:
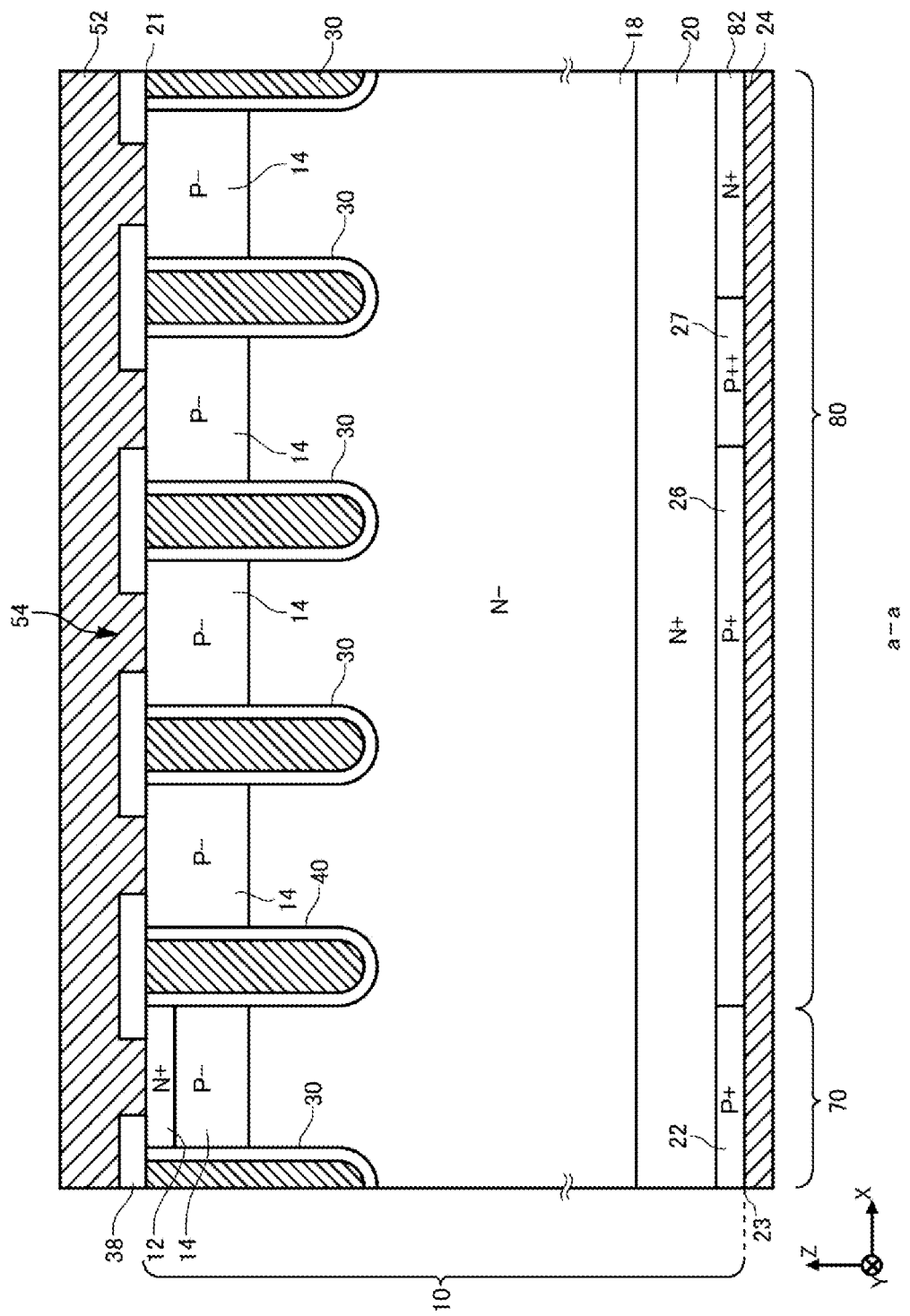
FIG. 8 is a diagram illustrating another example of the a-a cross section in FIG. 3.

FIG. 8 is a diagram illustrating another example of the a-a cross section in FIG. 3. The overlap region 26 of this example includes a high concentration portion 27 which has a doping concentration higher than the collector region 22.

The doping concentration of the high concentration portion 27 may be twice or more than the doping concentration of the collector region 22, may be five times or more, or may be ten times or more. With the high concentration portion 27, the amount of hole implantation from the lower surface of the diode portion 80 can be further increased.

The high concentration portion 27 may be in contact with the cathode region 82. In another example, the high concentration portion 27 may be in contact with the collector region 22. A part of the overlap region 26 may be the high concentration portion 27. The entire overlap region 26 may be the high concentration portion 27.

Figure 9:
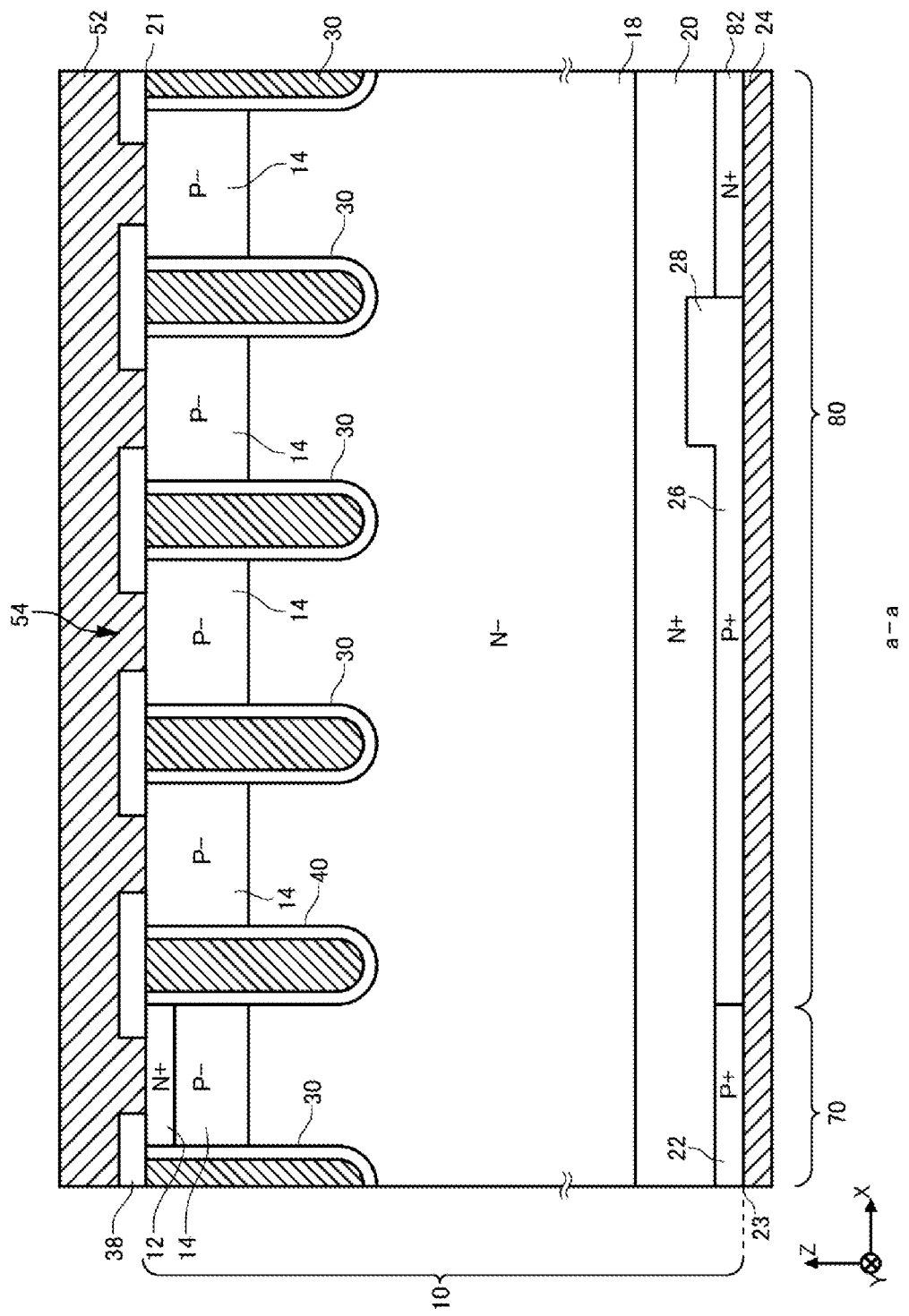
FIG. 9 is a diagram illustrating another example of the a-a cross section in FIG. 3.

FIG. 9 is a diagram illustrating another example of the a-a cross section in FIG. 3. The overlap region 26 of this example includes a thick portion 28 of which the thickness in the Z axis direction is larger than that of the collector region 22. The thickness of the thick portion 28 may be 1.2 times or more than the thickness of the collector region 22, may be 1.5 times or more, or may be 2 times or more. As the thickness of the collector region 22, an average thickness of the collector region 22 may be used. The thickness of the thick portion 28 may be a maximum thickness of the overlap region 26.

With the thick portion 28, the amount of hole implantation from the lower surface of the diode portion 80 can be further increased. The thick portion 28 may be in contact with the cathode region 82. In another example, the thick portion 28 may be in contact with the collector region 22. The entire overlap region 26 may be the thick portion 28. In addition, the thick portion 28 may be the high concentration portion 27. In other words, the overlap region 26 may include a portion where the doping concentration is higher than that of the collector region 22, and the thickness is large.

Figure 10:
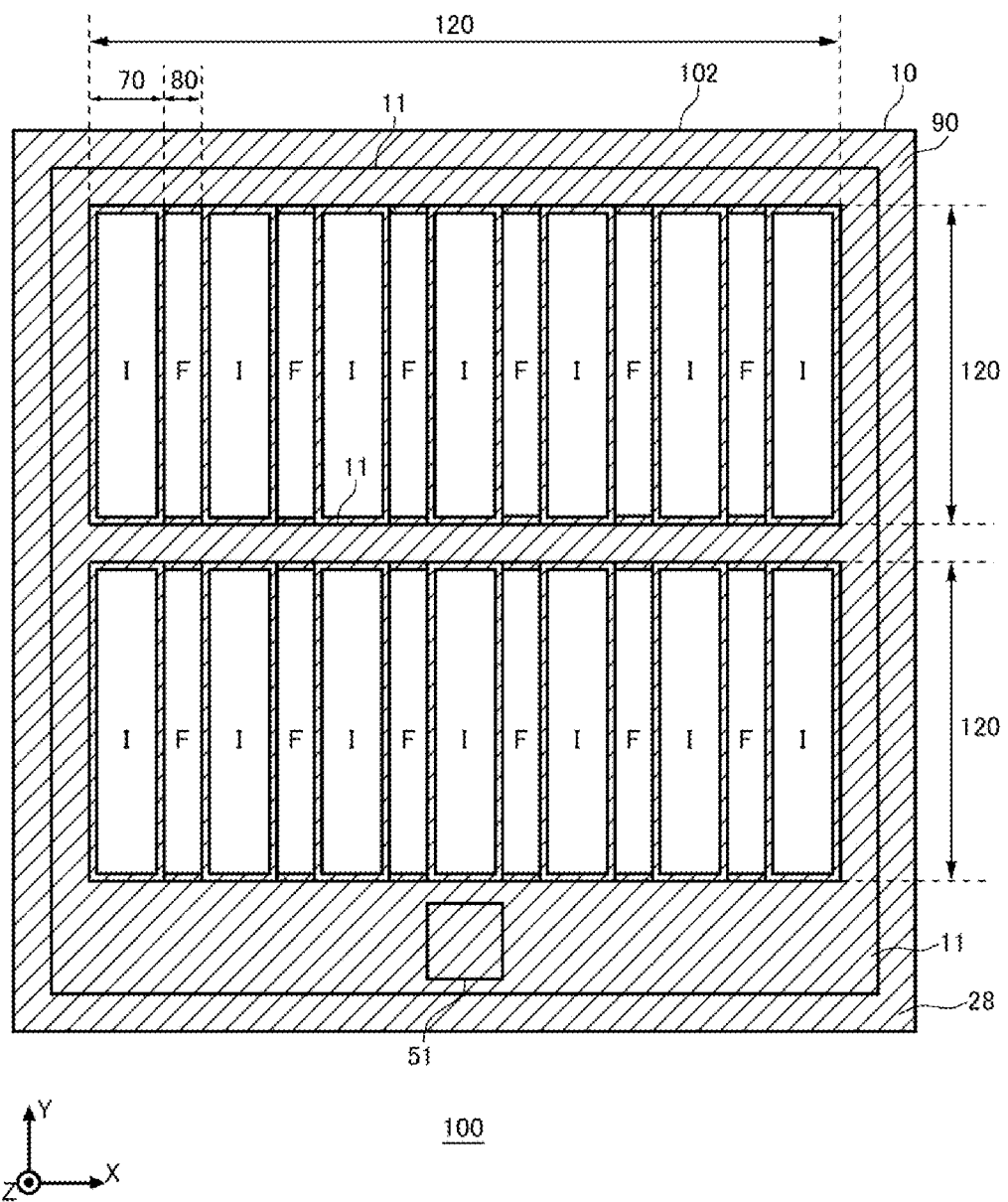
FIG. 10 is a top view illustrating an arrangement example of a thick portion 28.

FIG. 10 is a top view illustrating an arrangement example of the thick portion 28. In FIG. 10, the thick portion 28 is hatched with inclined lines. The thick portion 28 is provided at the end of the lower surface region 19. The thick portion 28 may be provided at the end of the lower surface region 19 in the X axis direction. The thick portion 28 may be provided at the end of the lower surface region 19 in the Y axis direction.

The end of the lower surface region 19 includes a portion which is in contact with the cathode region 82 in the lower surface region 19. The thick portion 28 may be provided in a portion which is in contact with the cathode region 82 in the X axis direction in the lower surface region 19. The thick portion 28 may be provided in a portion which is in contact with the cathode region 82 in the Y axis direction in the lower surface region 19. The thick portion 28 may be arranged to surround the cathode region 82 in a top view.

In addition, the thick portion 28 may be provided in the lower surface region 19 at the end of the semiconductor substrate 10. The thick portion 28 may be arranged even between the edge side 102 of the semiconductor substrate 10 and the active portion 120. The thick portion 28 may be also provided in the region overlapping with the well region 11. The thick portion 28 may be also provided in the edge terminal structure portion 90.

The thick portion 28 may have a thickness larger than that of other portion of the lower surface region 19. As described in FIGS. 1 to 9, the lower surface region 19 may include the overlap region 26 in the X axis direction. In this case, the end of the lower surface region 19 in the X axis direction is arranged in the diode portion 80. Therefore, as illustrated in FIG. 9, the thick portion 28 is arranged in the diode portion 80.

In another example, the lower surface region 19 may not include the overlap region 26 in the X axis direction. In this case, the boundary between the transistor portion 70 and the diode portion 80 becomes the end of the lower surface region 19 in the X axis direction. In other words, the positions of the end of the diode portion 80 in the X axis direction and the end of the cathode region 82 are matched. Therefore, the thick portion 28 is provided in a region which is in contact with the diode portion 80 in the transistor portion 70. FIG. 10 illustrates an example in which the lower surface region 19 does not include the overlap region 26 in the X axis direction.

The thick portion 28 may be provided to surround each transistor portion 70 in a top view. The collector region 22 may be surrounded by the thick portion 28 in a top view.

Figure 11:
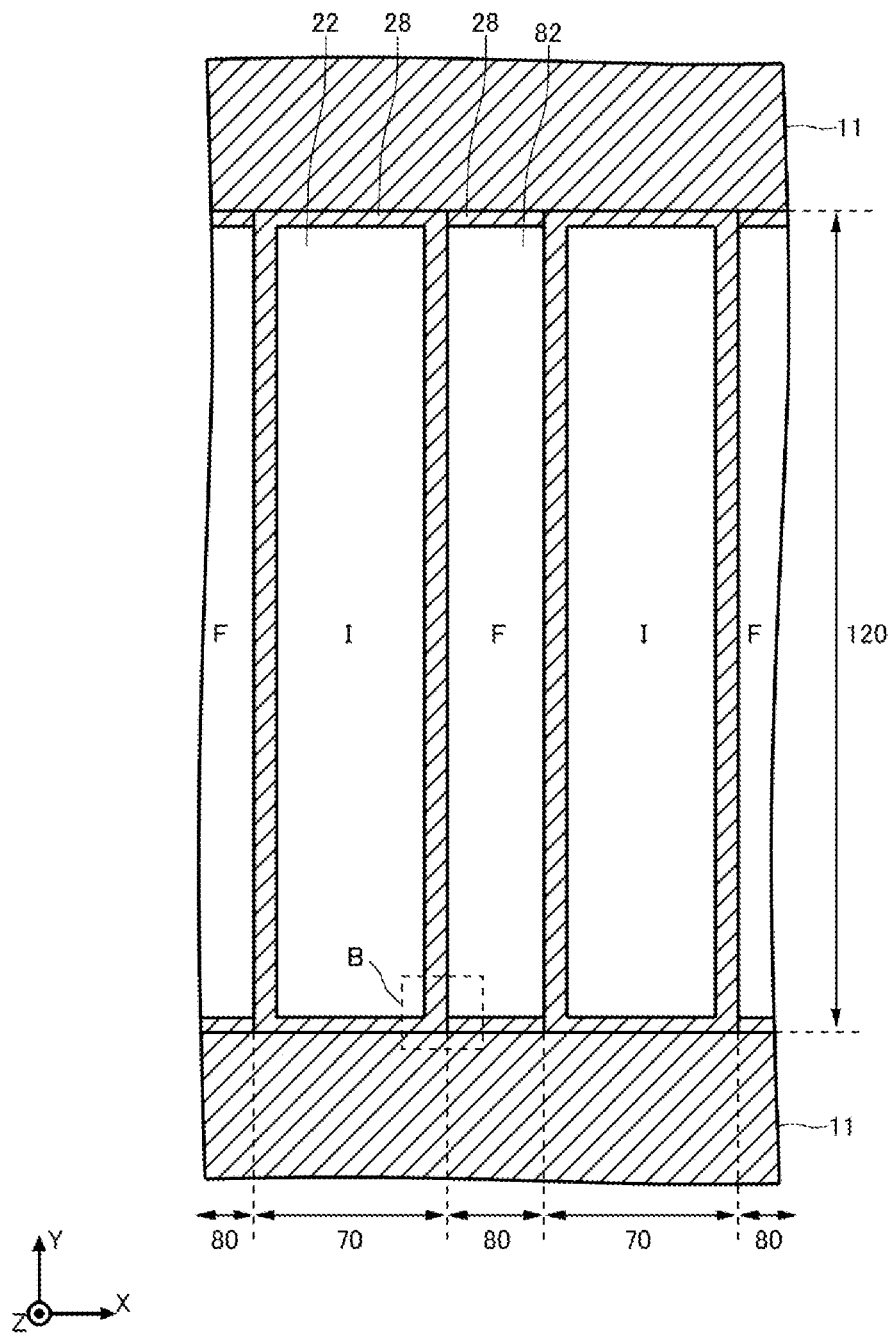
FIG. 11 is a diagram illustrating an arrangement example of the thick portion 28 in the diode portion 80 and a transistor portion 70.

FIG. 11 is a diagram illustrating an arrangement example of the thick portion 28 in the diode portion 80 and the transistor portion 70. In this example, the thick portion 28 at the boundary between the diode portion 80 and the transistor portion 70 is provided in the transistor portion 70. The thick portion 28 may be provided to be in contact with the boundary between the transistor portion 70 and the diode portion 80. In another example, as illustrated in FIG. 9, the thick portion 28 may be provided in the diode portion 80.

In addition, the thick portion 28 is also provided at the ends of the diode portion 80 and the transistor portion 70 in the Y axis direction. With this configuration, the diode portion 80 and the transistor portion 70 each are surrounded by the thick portion 28. As a result, the amount of hole implantation from the lower surface can be increased at the ends of the diode portion 80 and the transistor portion 70.

Figure 12:
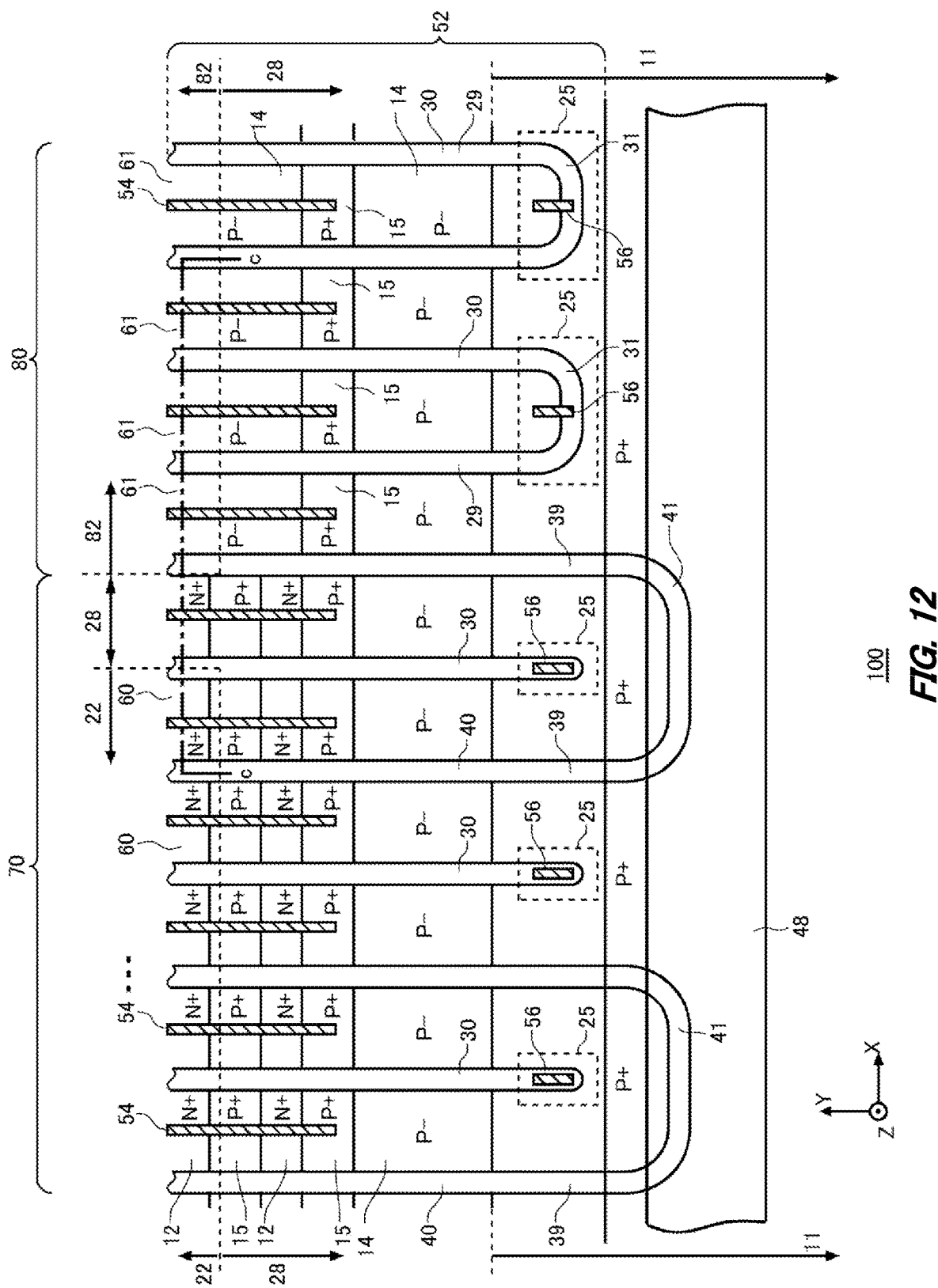
FIG. 12 is a top view illustrating Region B in FIG. 11 in a magnified scale.

FIG. 12 is a top view illustrating Region B in FIG. 11 on a magnified scale. In the semiconductor device 100 of this example, the arrangement of the cathode region 82 and the lower surface region 19 (the collector region 22 and the thick portion 28 in FIG. 12) is different from the semiconductor device 100 illustrated in FIG. 3. The other configurations are the same as those of the semiconductor device 100 illustrated in FIG. 3.

In this example, the cathode region 82 is provided in the entire diode portion 80 in the X axis direction. The thick portion 28 is provided between the cathode region 82 and the collector region 22 in the X axis direction. With such a structure, the amount of hole implantation from the lower surface can be increased at the boundary between the diode portion 80 and the transistor portion 70.

Figure 13:
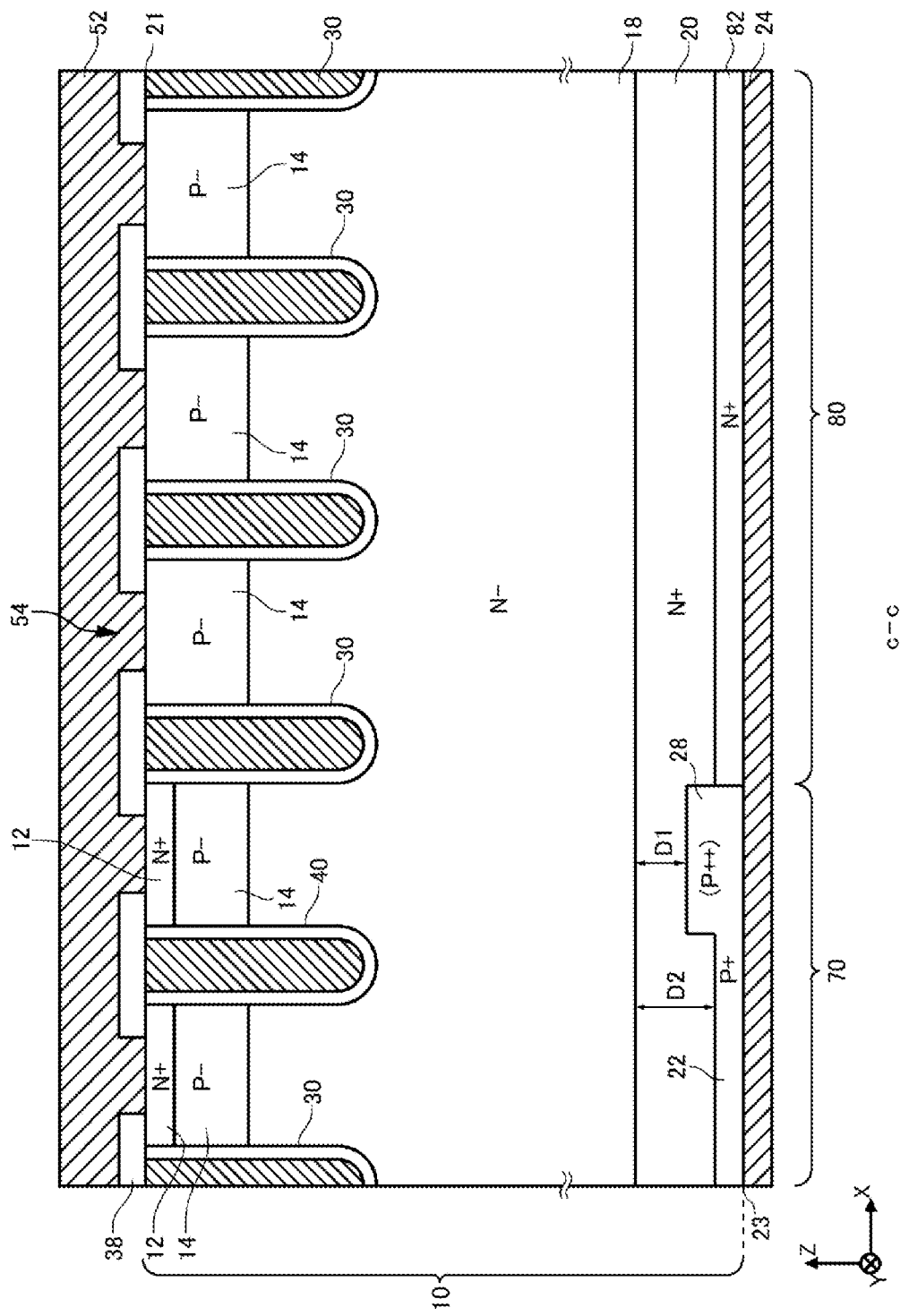
FIG. 13 is a diagram illustrating an example of a c-c cross section in FIG. 12.

FIG. 13 is a diagram illustrating an example of a c-c cross section in FIG. 12. As described in FIG. 12, the thick portion 28 is arranged between the cathode region 82 and the collector region 22. Further, the thick portion 28 may have the same doping concentration as that of the high concentration portion 27 described in FIG. 8. In other words, at the end of the lower surface region 19, there may be provided a portion which has a doping concentration higher than the collector region 22 and has a large thickness in the Z axis direction. As a result, the amount of hole implantation from the lower surface can be further increased at the boundary between the diode portion 80 and the transistor portion 70.

At least a part of the thick portion 28 may be provided in the buffer region 20. In other words, the thick portion 28 may be provided to protrude from the lower surface of the buffer region 20 toward the inside of the buffer region 20.

A distance D1 between the thick portion 28 and the drift region 18 in the Z axis direction (that is, the thickness of the buffer region 20 between the thick portion 28 and the drift region 18) may be 1 μm or more. The distance D1 may be 2 μm or more. When the distance D1 is secured to 1 μm or more, it is possible to suppress the depletion layer, which spreads from the upper surface side of the semiconductor substrate 10, from reaching the thick portion 28.

The distance between the collector region 22 and the drift region 18 in the Z axis direction is set to D2. The distance D2 corresponds to the thickness of the buffer region 20. The distance D1 may be equal to or less than the half of the distance D2, or may be equal to or less than ¼.

Figure 14:
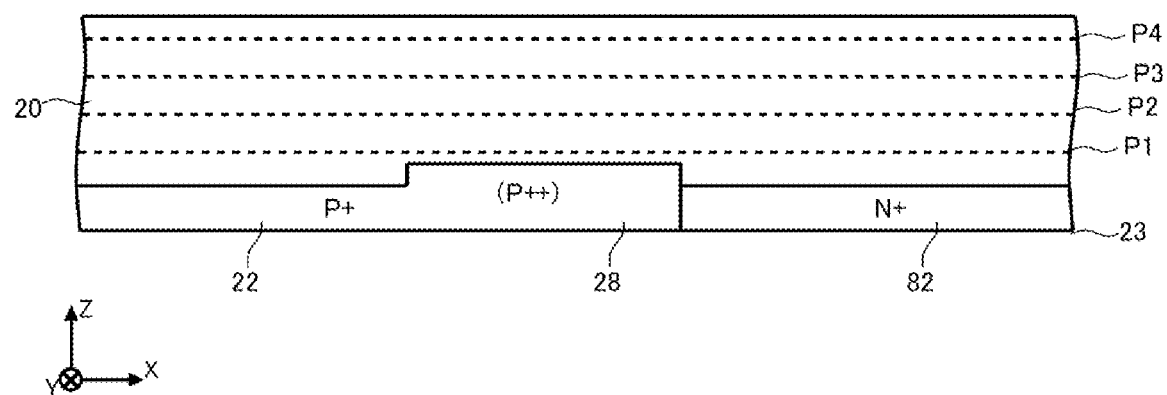
FIG. 14 is a diagram illustrating an example of a relationship between a buffer region 20 and the thick portion 28.

FIG. 14 is a diagram illustrating an example of the relationship between the buffer region 20 and the thick portion 28. The buffer region 20 of this example has a plurality of doping concentration peaks P1 to P4 in the Z axis direction. For example, the plurality of concentration peaks can be formed in the buffer region 20 by injecting impurities such as proton multiple times to the buffer region 20 with different ranges.

Among the plurality of concentration peaks P, the concentration peak closest to the lower surface 23 of the semiconductor substrate 10 is set to P1. The concentration peak P1 may be a peak having a highest doping concentration among the plurality of concentration peaks. The plurality of concentration peaks have their doping concentration adjusted such that the depletion layer which spreads from the upper surface side of the semiconductor substrate 10 does not exceed the concentration peak P1 so as not to spread to the lower surface 23.

The upper end of the thick portion 28 is arranged on the lower surface 23 side from the concentration peak P1. As a result, it is possible to suppress that the depletion layer which spreads from the upper surface side of the semiconductor substrate 10 reaches the thick portion 28.

Figure 15:
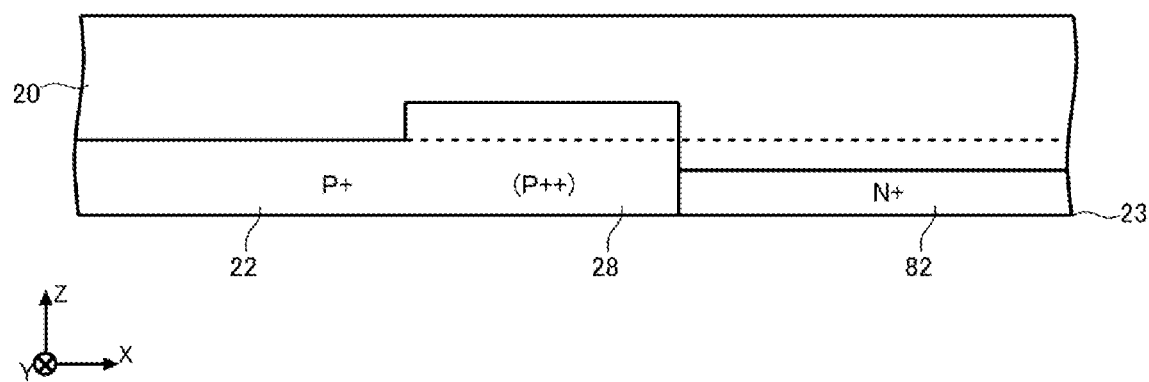
FIG. 15 is a diagram illustrating an example of thickness of a lower surface region 19 (a collector region 22 in FIG. 15) and the collector region 22.

FIG. 15 is a diagram illustrating an example of the thicknesses of the lower surface region 19 (the collector region 22 in FIG. 15) and the collector region 22. The P type dopant concentration of the collector region 22 of this example is higher than the N type dopant concentration in the cathode region 82. The collector region 22 may include the N type dopant having the same concentration as that of the cathode region 82. Since the cathode region 82 is formed in the entire lower surface 23 of the semiconductor substrate 10, the collector region 22 may be formed by counter-doping a P type dopant. The thickness of the collector region 22 may be larger than the thickness of the cathode region 82.

Figure 16:
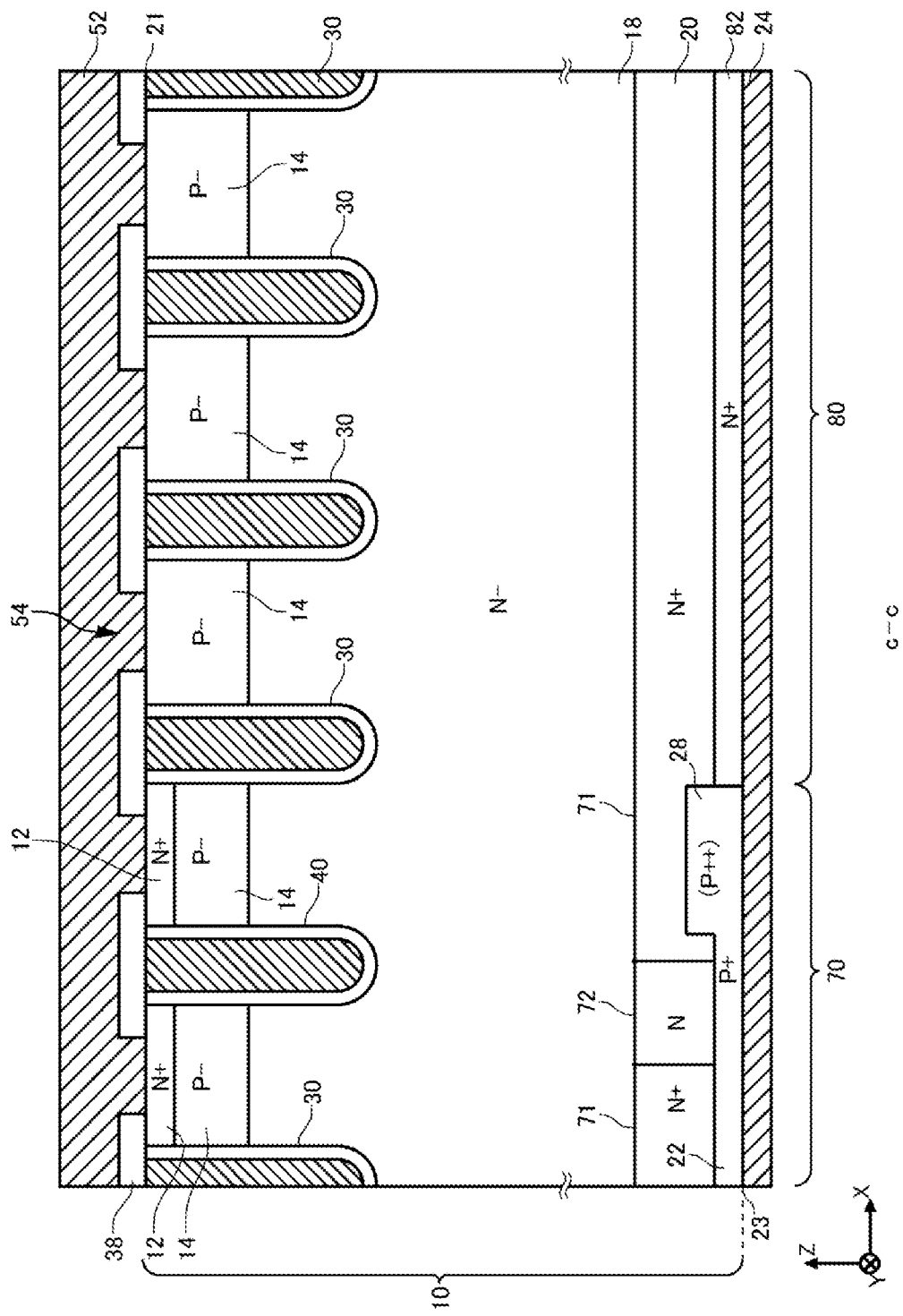
FIG. 16 is a diagram illustrating another configuration example of the buffer region 20.

FIG. 16 is a diagram illustrating another configuration example of the buffer region 20. The buffer region 20 of this example includes a high concentration region 71 and a low concentration region 72. The low concentration region 72 is a region which is arranged side by side with the high concentration region 71 in the X axis direction, and has a doping concentration lower than the high concentration region 71. The low concentration region 72 may be sandwiched by the high concentration region 71 in the X axis direction. In addition, in the X axis direction, the low concentration region 72 may be shorter than the high concentration region 71. By providing the low concentration region 72, the amount of hole implantation from the lower surface can be further increased.

The thick portion 28 is preferably provided at a position which does not overlap with the low concentration region 72. If the thick portion 28 and the low concentration region 72 are arranged in the Z axis direction, the depletion layer spreading from the upper surface side of the semiconductor substrate 10 is likely to reach the thick portion 28. By arranging the thick portion 28 and the low concentration region 72 to be shifted, the amount of hole implantation from the lower surface can be further increased while suppressing the depletion layer from reaching the thick portion 28.

In the X axis direction, the low concentration region 72 may be arranged on the central side of the transistor portion 70 from the thick portion 28. By providing the low concentration region 72 in the transistor portion 70, it is possible to reduce the influence of the low concentration region 72 on the characteristics of the diode portion 80. The thick portion 28 may be arranged at both ends of the transistor portion 70 in the X axis direction. The low concentration region 72 may be arranged in the region of the transistor portion 70 between two thick portions 28. The distance between the low concentration region 72 and the thick portion 28 in the X axis direction may be smaller than the width of one mesa portion 60 in the X axis direction.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 10 semiconductor substrate
11 well region
12 emitter region
14 base region
15 contact region
18 drift region
19 lower surface region
20 buffer region
21 upper surface
22 collector region
23 lower surface
24 collector electrode
25 connection portion
26 overlap region
27 high concentration portion
28 thick portion
29 stretching portion
30 dummy trench portion
31 edge portion
32 dummy insulating film
34 dummy conductive portion
38 interlayer dielectric film
39 stretching portion
40 gate trench portion
41 edge portion
42 gate insulating film
44 gate conductive portion
48 gate runner
51 gate pad
52 emitter electrode
54, 56 contact hole
60, 61 mesa portion
70 transistor portion
71 high concentration region
72 low concentration region
80 diode portion
82 cathode region
90 edge terminal structure portion
92 upper-surface-side lifetime control portion 100 semiconductor device
102 edge side
120 active portion

What is claimed is:

1. A semiconductor device, comprising:
a semiconductor substrate that includes a first conductivity type drift region;
a transistor portion that includes a first conductivity type emitter region having a doping concentration higher than the drift region in a region which is in contact with an upper surface of the semiconductor substrate; and
a diode portion that includes a first conductivity type cathode region having a doping concentration higher than the drift region in a region which is in contact with a lower surface of the semiconductor substrate, and is arranged side by side with the transistor portion in a preset arrangement direction in an upper surface of the semiconductor substrate; and
a second conductivity type lower surface region that is provided in a region other than the cathode region in a region which is in contact with the lower surface of the semiconductor substrate,
wherein the lower surface region includes a thick portion in which an end portion in a top view has a larger thickness in a depth direction of the semiconductor substrate than other portions.

2. The semiconductor device according to claim 1, wherein the lower surface region includes the thick portion at the end portion in the arrangement direction.

3. The semiconductor device according to claim 2, wherein the lower surface region includes the thick portion at the end portion which is in contact with the cathode region in the arrangement direction.

4. The semiconductor device according to claim 1, wherein the lower surface region includes the thick portion at the end portion in the stretching direction orthogonal to the arrangement direction.

5. The semiconductor device according to claim 1, wherein the lower surface region includes the thick portion at an end of the semiconductor substrate in a top view.

6. The semiconductor device according to claim 1, wherein the thick portion is arranged in the transistor portion.

7. The semiconductor device according to claim 1, wherein the thick portion is arranged in the diode portion.

8. The semiconductor device according to claim 1, wherein a doping concentration of the thick portion is higher than a doping concentration of a portion other than the thick portion of the lower surface region.

9. The semiconductor device according to claim 1, further comprising:
a buffer region that is provided between the drift region and the lower surface region, and has a doping concentration higher than the drift region,
wherein a distance between the drift region and the thick portion is 1 µm or more.

10. The semiconductor device according to claim 1, further comprising:
a buffer region that is provided between the drift region and the lower surface region, and has a doping concentration higher than the drift region,
wherein the buffer region includes a high concentration region and a low concentration region which is arranged side by side with the high concentration region in the arrangement direction, and has a doping concentration lower than the high concentration region, and
wherein the thick portion is provided at a position which does not overlap with the low concentration region.

11. The semiconductor device according to claim 10, wherein the low concentration region is arranged closer to a central side of the transistor portion than the thick portion in the arrangement direction.

12. The semiconductor device according to claim 1, wherein a dopant concentration of the second conductivity type in the lower surface region is higher than a dopant concentration of the first conductivity type in the cathode region, and
wherein the lower surface region is thicker than the cathode region in the depth direction of the semiconductor substrate.

* * * * *